(12) United States Patent
Kadotani et al.

(10) Patent No.: US 7,288,875 B2
(45) Date of Patent: Oct. 30, 2007

(54) LAMINATED PIEZOELECTRIC ELEMENT AND ITS MANUFACTURING METHOD

(75) Inventors: Shige Kadotani, Chita-gun (JP); Akio Iwase, Nishio (JP)

(73) Assignee: DENSO Corporation, Kariya, Aichi-pref. (JP)

( * ) Notice: Subject to any disclaimer, the term of this patent is extended or adjusted under 35 U.S.C. 154(b) by 0 days.

(21) Appl. No.: 11/289,568

(22) Filed: Nov. 30, 2005

(65) Prior Publication Data

US 2006/0119219 A1 Jun. 8, 2006

(30) Foreign Application Priority Data

Dec. 6, 2004 (JP) ............................. 2004-353165
Jul. 26, 2005 (JP) ............................. 2005-216123

(51) Int. Cl.
*H01L 41/08* (2006.01)

(52) U.S. Cl. ....................................... 310/328; 310/366
(58) Field of Classification Search ................. 310/328
See application file for complete search history.

(56) References Cited

U.S. PATENT DOCUMENTS 4,633,120 A * 12/1986 Sato et al. .................. 310/328
4,845,399 A * 7/1989 Yasuda et al. .............. 310/366
5,237,239 A * 8/1993 Inoue et al. ................. 310/328
6,700,306 B2 * 3/2004 Nakamura et al. .......... 310/328
6,873,089 B2 * 3/2005 Kobayashi et al. ......... 310/328
6,978,525 B2 * 12/2005 Iwase et al. ................ 29/25.35
7,042,143 B2 * 5/2006 Bindig et al. ............... 310/366

FOREIGN PATENT DOCUMENTS

JP 9-270540 10/1997

* cited by examiner

*Primary Examiner*—Mark Budd
(74) *Attorney, Agent, or Firm*—Nixon & Vanderhye P.C.

(57) ABSTRACT

This invention provides a laminated piezoelectric element that suppresses the peeling off of an electrically conductive adhesive and has excellent durability and high reliability, and a method of manufacturing the laminated piezoelectric element. A laminated piezoelectric element 1 has a ceramic laminate 10 formed by alternately laminating a piezoelectric layer 11 of a piezoelectric material and inner electrode layers 21 and 22 having electrical conductivity, and by having protection layers 12 of ceramics formed at both ends of the ceramic laminate 10 in a lamination direction, and that has an external electrode 34 connected to side surfaces 101 and 102 of the ceramic laminate 10 via an electrically conductive adhesive 33. One or more trenches 13 recessed inward are formed on side surfaces 121 and 122 of at least one of the protection layers 12 at both ends, and the electrically conductive adhesive 33 is filled in at least a part of the trenches 13.

6 Claims, 24 Drawing Sheets

LAMINATED PIEZOELECTRIC ELEMENT AND ITS MANUFACTURING METHOD

This application is a new U.S. patent application that claims benefit of JP 2004-353165, filed 6 Dec. 2004 and JP 2005-216123, filed 26 Jul. 2005, the entire contents of each of which are hereby incorporated by reference.

FIELD OF THE INVENTION

The present invention relates to a laminated piezoelectric element that can be applied to a piezoelectric actuator or the like, and a method of manufacturing the laminated piezoelectric element.

BACKGROUND OF THE INVENTION

In recent years, from the viewpoint of environmental concerns, fuel consumption, and the exhaust gas of automobiles, development of fuel injectors for automobiles using a laminated piezoelectric element has progressed.

The laminated piezoelectric element usually has a ceramic laminate that is formed by alternately laminating a piezoelectric layer of a piezoelectric material and inner electrode layers having electrical conductivity, and by having protection layers formed at both ends of the ceramic laminate in a lamination direction. An external electrode is connected to side surfaces of the ceramic laminate via an electrically conductive adhesive. A voltage is applied to between inner electrodes, thereby generating a displacement, in the piezoelectric layer, for driving.

When this laminated piezoelectric element is used for an injector, conventionally, various problems occur due to the injector being is used at a high temperature for a long period.

For example, an electrically conductive adhesive is coated on the side surface of the ceramic laminate to connect an external electrode to the ceramic laminate. However, there is a risk that the electrically conductive adhesive is peeled off from the side surface of the ceramic laminate due to the stress generated by a piezoelectric displacement, resulting in a failure in electric conduction. Particularly, protection layers that are formed at upper and lower ends of the ceramic laminate are applied with larger stress than that applied to other parts, due to the piezoelectric displacement. Therefore, the electrically conductive adhesive can be easily peeled off from these protection layers.

As a method of solving the above problems from the viewpoint of a material, use of a flexible material for the electrically conductive adhesive, that can cope with the piezoelectric displacement, has been proposed. However, because of the severe environment in which the electrically conductive adhesive is used, the usable materials are limited. Further, there is a limit to the performance of materials. Therefore, it is not effective to improve the materials.

On the other hand, configurations have not yet been improved. In Japanese Patent Unexamined Publication No. 9-270540, protection layers having an electrostriction material and an inner electrode laminated alternately are shown. However, no measure is taken to improve adhesive strength of the electrically conductive adhesive. Therefore, this proposal cannot solve the above problems.

The present invention has been made in the light of the above conventional problems. The invention provides a laminated piezoelectric element that suppresses the peeling off of the electrically conductive adhesive and has excellent durability and high reliability, and a method of manufacturing the laminated piezoelectric element.

SUMMARY OF THE INVENTION

A first aspect of the invention is a laminated piezoelectric element comprising a ceramic laminate formed by alternately laminating piezoelectric layers of a piezoelectric material and inner electrode layers having electrical conductivity and by having protection layers of ceramics formed at both ends of the ceramic laminate in a lamination direction, and an external electrode connected to side surfaces of the ceramic laminate via an electrically conductive adhesive, wherein one or more trenches recessed inward are formed on side surfaces of at least one of the protection layers formed at both ends of the ceramic laminate, and the electrically conductive adhesive is filled in at least a part of the trenches.

The laminated piezoelectric element according to the present invention has the protection layers of ceramics formed at both ends of the ceramic laminate in a lamination direction. One or more trenches recessed inward are formed on side surfaces of at least one of the protection layers formed at both ends of the ceramic laminate, and the electrically conductive adhesive is filled in at least a part of the trenches. Therefore, the laminated piezoelectric element can suppress the peeling off of the electrically conductive adhesive, and has a configuration having excellent durability and high reliability.

Because the electrically conductive adhesive is filled in at least a part of the one or more trenches formed on the side surface of the protection layer, adhesiveness between the protection layer and the electrically conductive adhesive can be improved based on the anchor effect. Therefore, the electrically conductive adhesive has adhesive strength that can bear the stress generated by the voltage displacement. Consequently, peeling off does not occur easily. In other words, the protection layer can suppress the peeling off of the electrically conductive adhesive.

Using the above arrangement, the laminated piezoelectric element formed with the protection layers having the above configuration can suppress the peeling off of the electrically conductive adhesive. As a result, the laminated piezoelectric element exhibits sufficient durability during long-term use, and can provide high reliability.

The protection layers are formed at both ends of the ceramic laminate in a lamination direction where larger stress is applied than that applied to other parts due to a piezoelectric displacement. Therefore, the protection layers can exhibit more sufficiently the effect of suppressing the peeling off of the electrically conductive adhesive.

The trenches can be formed on one of the protection layers at both sides of the ceramic laminate, or can be formed on both protection layers.

As explained above, according to the present invention, it is possible to provide a laminated piezoelectric element that can suppress the peeling off of the electrically conductive adhesive and has excellent durability and high reliability.

A second aspect of the invention is a method of manufacturing a laminated piezoelectric element comprising a ceramic laminate formed by alternately laminating piezoelectric layers of a piezoelectric material and inner electrode layers having electrical conductivity and by having protection layers of ceramic formed at both ends of the ceramic laminate in a lamination direction, and an external electrode connected to side surfaces of the ceramic laminate via an electrically conductive adhesive, wherein, in forming at least one of the protection layers at both sides of the ceramic laminate, the method comprises at least:

a printing step of printing a vanishing slit layer that vanishes when a green sheet is sintered, and printing a spacer layer having approximately the same thickness as that of the vanishing slit layer in a region adjacent to a region in which the vanishing slit layer is printed;

a press laminating step of forming a laminate precursor by laminating and pressing the green sheet; and a sintering step of forming trenches recessed inward by vanishing the vanishing slit layer by firing the laminate precursor.

In forming at least one of the protection layers at both sides of the ceramic laminate, the manufacturing method according to the present invention has at least the printing step, the press laminating step, and the sintering step. First, at the printing step, the vanishing slit layer and the spacer layer are printed on the green sheet, and then the press-laminating step is carried out. At the sintering step, the vanishing slit layer vanishes after firing, thereby forming trenches recessed inward. Therefore, the laminated piezoelectric element obtained by forming the protection layers can suppress the peeling off of the electrically conductive adhesive, and has a configuration having excellent durability and high reliability.

By forming the vanishing slit layer at the printing step, the trenches recessed inward are formed on the protection layer obtained after the sintering step. When the electrically conductive adhesive is filled into the trenches, adhesiveness between the protection layer and the electrically conductive adhesive can be improved based on the anchor effect. Therefore, the electrically conductive adhesive has adhesive strength that can bear the stress generated by the voltage displacement. Consequently, peeling off does not occur easily. In other words, the protection layer can suppress the peeling off of the electrically conductive adhesive.

Using this arrangement, the laminated piezoelectric element manufactured by forming the protection layer having the above configuration can suppress the peeling off of the electrically conductive adhesive. As a result, the laminated piezoelectric element exhibits sufficient durability during a long-term use, and can obtain high reliability.

The protection layers are formed at both ends of the ceramic laminate in a lamination direction where larger stress is applied than that applied to other parts due to a piezoelectric displacement. Therefore, the protection layers can exhibit more sufficiently the effect of suppressing the peeling off of the electrically conductive adhesive.

The trenches can be formed on one of the protection layers at both sides of the ceramic laminate, or can be formed on both protection layers.

As explained above, according to the present invention, it is possible to provide a laminated piezoelectric element that can suppress the peeling off of the electrically conductive adhesive and has excellent durability and high reliability.

DETAILED DESCRIPTION

In the first aspect of the invention, it is preferable that the protection layer is made of the same piezoelectric material as that of the piezoelectric layer.

In this case, shape precision of the ceramic laminate including the protection layer and the piezoelectric layer can be improved.

Preferably, the trenches are formed on the whole periphery of the side surface of the protection layer.

In general, the side surface of the ceramic laminate is molded with a molding material of an insulating resin over the whole periphery, thereby securing insulation. Therefore, the molding material can be filled into the trenches that are not filled with the electrically conductive adhesive. Consequently, adhesiveness between the molding material and the ceramic laminate can be improved, thereby suppressing the occurrence of a peeling off of the molding material. Further, adhesive strength of the electrically conductive adhesive that is present between the molding material and the ceramic laminate can be improved.

The trenches can be formed intermittently in a predetermined pattern.

In this case, by filling the electrically conductive adhesive into the trenches formed intermittently, a larger anchor effect can be obtained. Therefore, adhesive strength of the electrically conductive adhesive on the protection layer can be further improved.

Preferably, the size of at least a part of the internal width of the trench is larger than a size of the width of an opening exposed to the side surfaces of the protection layer.

In this case, by filling the electrically conductive adhesive into the trenches, a larger anchor effect can be obtained. Therefore, adhesive strength of the electrically conductive adhesive on the protection layer can be further improved.

Preferably, the laminated piezoelectric element is an injector piezoelectric actuator that is used for a drive source of an injector.

The injector is used in a severe state of a high temperature environment. Therefore, when the excellent laminated piezoelectric element is used for the actuator, reliability and durability can be improved, thereby improving the total performance of the injector.

In the second aspect of the invention, at the printing step, only the spacer layer can be printed without printing vanishing slits on the green sheet.

In other words, on the green sheet, the spacer layer is printed on the part other than the part on which the trenches are formed. In this case, the trenches can be formed without printing the vanishing slit layer on the green sheet.

EXAMPLES

Example 1

A laminated piezoelectric element and a method of manufacturing the laminated piezoelectric element according to examples of the present invention are explained with reference to FIG. 1 to FIG. 10.

Figure 1:
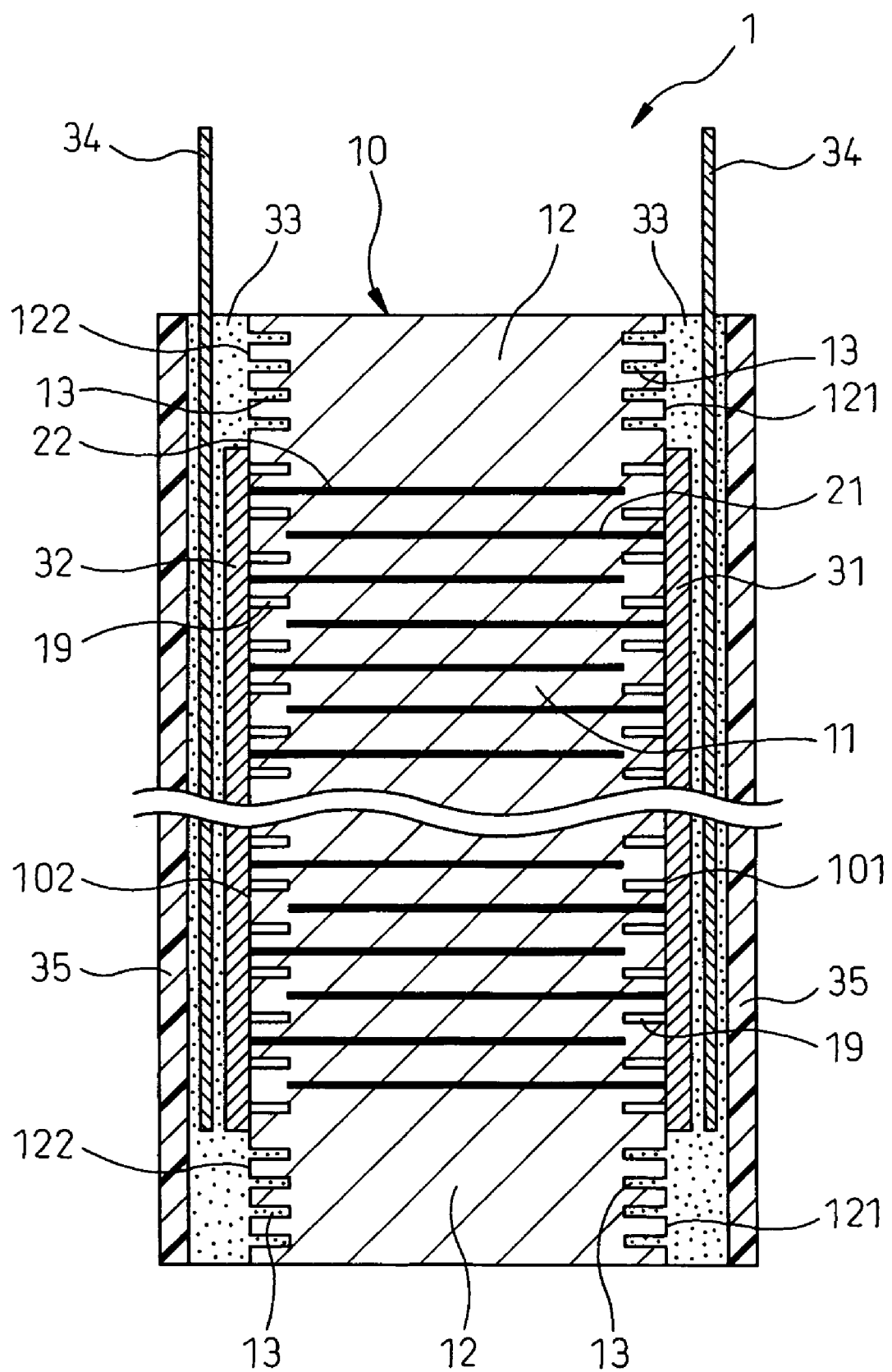
FIG. 1 is an explanatory diagram of a configuration of a laminated piezoelectric element according to Example 1.

As shown in FIG. 1, a laminated piezoelectric element 1 has a ceramic laminate 10 formed by alternately laminating a piezoelectric layer 11 of a piezoelectric material and inner electrode layers 21 and 22 having electrical conductivity, and by having protection layers 12 of ceramics formed at both ends of the ceramic laminate 10 in a lamination direction, and that has an external electrode 34 connected to side surfaces 101 and 102 of the ceramic laminate 10 via an electrically conductive adhesive 33.

One or more trenches 13 recessed inward are formed on side surfaces 121 and 122 of the protection layers 12, and the electrically conductive adhesive 33 is filled in at least a part of the trenches 13.

Figure 2:
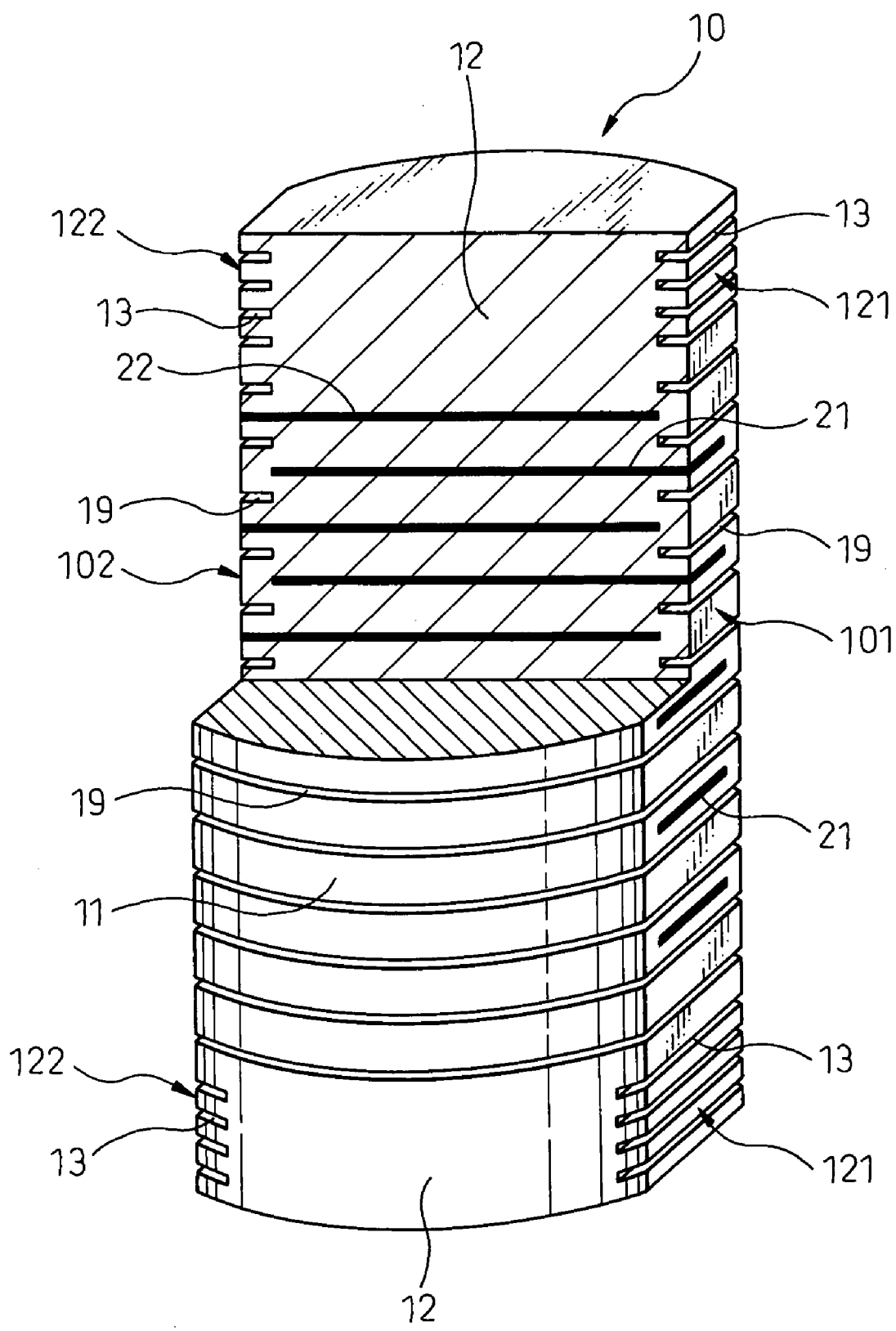
FIG. 2 is an explanatory diagram of a configuration of a ceramic laminate according to Example 1.

As shown in FIG. 2, in the laminated piezoelectric element 1, the ceramic laminate 10 has a barrel-shaped cross section having a pair of mutually opposite side surfaces 101 and 102 formed on the external peripheral surface of an approximately pillar-shaped laminate. The cross-sectional shape of the ceramic laminate 10 is not limited to this barrel shape, and can have various shapes such as a circular shape, a square shape, and an octagonal shape depending on a usage.

As shown in FIG. 1 and FIG. 2, the ceramic laminate 10 has the piezoelectric layer 11 and the inner electrode layers 21 and 22 laminated alternately. The protection layers 12 of ceramics are formed at both ends of the ceramic laminate 10 in a lamination direction. The plural trenches 13 recess inward are formed on both side surfaces 121 and 122 of the protection layer 12.

As shown in FIG. 1 and FIG. 2, on the side surface 101 of the ceramic laminate, the external peripheral end of the inner electrode layer 21 is exposed, and the external peripheral end of the inner electrode layer 22 is not exposed and is recessed inward. On the other hand, on the side surface 102 of the ceramic laminate, the external peripheral end of the inner electrode layer 22 is exposed, and the external peripheral end of the inner electrode layer 21 is not exposed and is recessed inward. The inner electrode layer 21 and the inner electrode layer 22 are disposed alternately in the lamination direction. In other words, the ceramic laminate 10 in the present example has what is called a partial electrode structure.

In addition to the partial electrode structure in the present example, various other structures including a whole-surface electrode structure can be used for the ceramic laminate 10.

As shown in FIG. 1 and FIG. 2, the ceramic laminate 10 has slits 19 at an intermediate part of the ceramic laminate 10 in the lamination direction of the adjacent inner electrodes 21 and 22. These slits 19 have slit intervals on the whole periphery of the side surfaces of the ceramic laminate, thereby mitigating stress generated due to a piezoelectric displacement.

The slits 19 can be disposed at different positions and with different shapes. Alternately, the slits 19 cannot be disposed.

As shown in FIG. 1, side-surface electrodes 31 and 32 are provided on the side surfaces 101 and 102 respectively of the ceramic laminate 10 excluding the protection layer 12. The side-surface electrode 31 is electrically connected to the inner electrode layers 21, and the side-surface electrode 32 is electrically connected to the inner electrode layers 22.

The external electrodes 34 are connected to the side surfaces 121 and 122 of the side-surface electrodes 31 and 32 and the protection layers 12 respectively via the electrically conductive adhesive 33. The electrically conductive adhesive 33 is filled in the trenches 13 formed on the side surfaces 121 and 122 of the protection layers 12.

The whole external peripheral surface of the ceramic laminate 10 is molded with a molding material 35 of an insulating resin.

The external electrodes 34 can be selectively connected to only the upper parts of the side surfaces 101 and 102 of the ceramic laminate 10. Alternatively, fetch electrodes 34 can be connected to the side surfaces 101 and 102 of the ceramic substrate 10 via the electrically conductive adhesive 33, without providing the side-surface electrodes 31 and 32.

A method of manufacturing the laminated piezoelectric element 1 according to the present example is explained below.

In the method of manufacturing the laminated piezoelectric element 1 according to the present example, in forming the protection layers 12, at least the following steps are carried out: a printing step of printing a vanishing slit layer 130 that vanishes when a green sheet 110 is sintered, and printing a spacer layer 111 having approximately the same thickness as that of the vanishing slit layer 130 in a region adjacent to a region in which the vanishing slit layer 130 is printed; a press laminating step of forming a laminate precursor (by which we means a laminate prior to sinter) 120 by laminating and pressing the green sheet 110; and a sintering step of forming the trenches 13 recessed inward by vanishing the vanishing slit layer 130 by firing the laminate precursor 120.

This is explained below in further detail.

Figure 3:
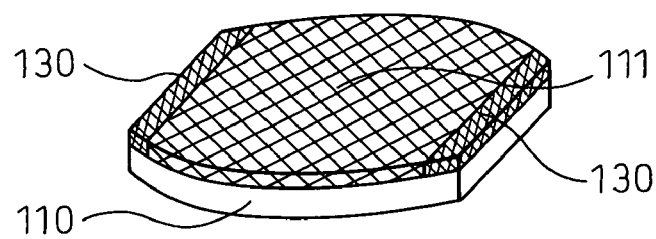
FIG. 3 is an explanatory diagram of a step of printing on a green sheet according to Example 1.

First, in order to produce the green sheet, a ceramic raw material powder such as lead zirconate titanate (PZT) is prepared, and this is calcined. Next, pure water and a dispersant are added to the calcined powder to prepare a slurried material. This slurried material is wet crushed with a pearl mill. This crushed material is dried, and is degreased, and is then added with a solvent, a binder, a plasticizer, and a dispersant. This added result is mixed with a ball mill. Slurry obtained as a result of the mixture is stirred with a stirrer in a vacuum device, thereby defoaming the slurry in the vacuum and adjusting the viscosity. The green sheet 110 shown in FIG. 3 is formed based on a doctor blade method.

In addition to the doctor blade method used in the present example, an extrusion method and various other methods can be also used to form the green sheet 110.

Next, the protection layers 12 are formed using the obtained green sheet 110.

In forming the protection layers 12, at least the printing step, the press laminating step, and the sintering step are carried out.

<Printing Step>

First, as shown in FIG. 3, the vanishing slit layers 130 of a vanishing material that vanish by firing are printed on the portion of the green sheet 110 punched in a predetermined shape where the trenches 13 are to be formed. In the present example, as shown in FIG. 3, the vanishing slit layers 130 are printed on the external periphery formed by linear outlines on the green sheet 110, and these parts are dried at 120 degrees centigrade for five minutes.

Next, as shown in FIG. 3, the spacer layer 111 of the slurry that constitutes the green sheet 110 is printed on the portion of the green sheet 110 where the vanishing slit layer 130 is not printed, in order to make the height of the part printed with the vanishing slit layer 130 approximately equal to the height of other printed parts on the green sheet 110.

In FIG. 3, the green sheet 110 is shown in a final shape of the barrel shape, for the sake of convenience.

<Press Laminating Step>

Figure 4:
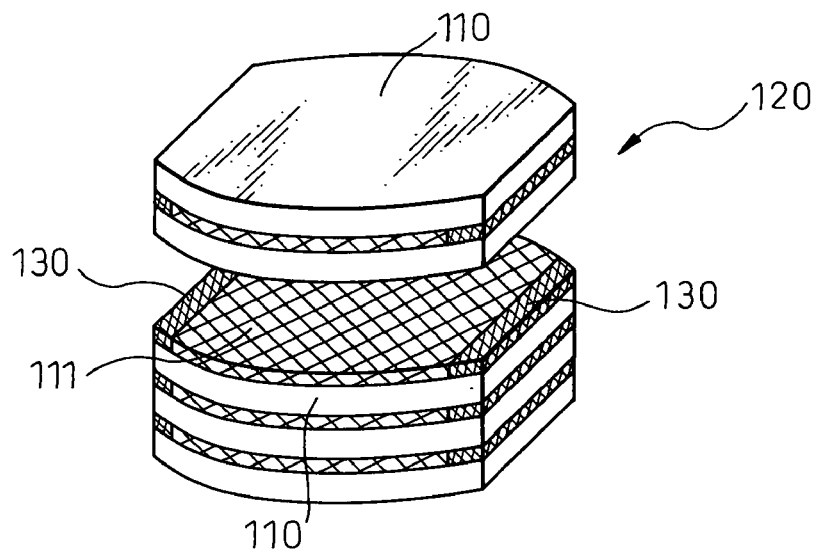
FIG. 4 is an explanatory diagram of a step of laminating green sheets according to Example 1.

Next, as shown in FIG. 4, the printed green sheet 11 is punched into the final barrel shape with a laminating tool not shown. After the laminated green sheet 110 is taken out from the laminating tool, the green sheet 110 is pressed by applying load of 500 g/cm² to the green sheet 110 from the lamination direction. The green sheet 110 is kept in this state for more than one hour, thereby obtaining the laminate precursor 120.

It is preferable that the green sheet 110 is laminated before the printed spacer layer 111 is dried. In other words, when the green sheet 120 is laminated while the spacer layer 111 is in the slurried state, the spacer layer 111 plays the role of the adhesive, and the green sheets 110 can be laminated easily. The green sheet 110 not yet printed is laminated on the upper end of the laminate precursor 120.

<Sintering Step>

After the obtained laminate precursor 120 is degreased, the degreased laminate precursor 120 is sintered at 1,050 degrees centigrade for two hours.

Figure 5:
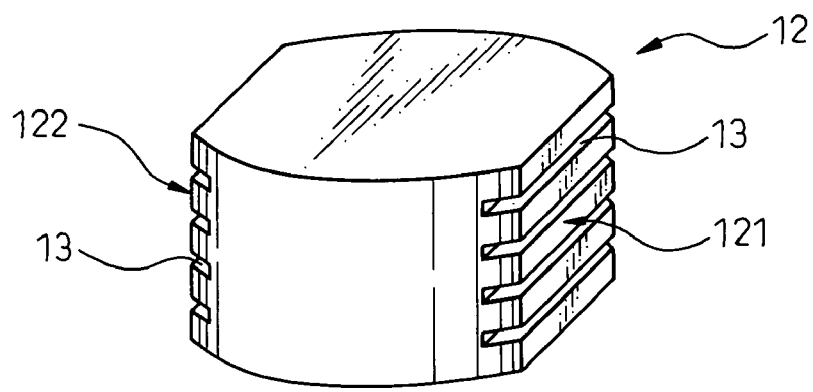
FIG. 5 is an explanatory diagram of a configuration of a protection layer according to Example 1.

Consequently, as shown in FIG. 5, the protection layer 12 of ceramics and having the trenches 13 recessed inward on the side surfaces 121 and 122 is obtained. The trenches 13 are obtained by firing the vanishing slit layers 130 of a vanishing material.

In the present example, a material of carbon particles that have small thermal deformation and that can maintain the high-precision shape of the trenches formed by the sintering is used for the vanishing material that constitutes the vanishing slit layer 130. In addition to the above material, powdery organic carbon particles obtained by carbonation can be also used. The organic carbon particles can be obtained by carbonating the powdery organic particles, and also can be obtained by crushing the carbonated organics. For the organics, polymer materials such as resins, and cereals such as corns, soy beans, and wheat flour can be also used. In this case, the manufacturing cost can be minimized.

Next, an intermediate laminate 100 (FIG. 6) that forms the ceramic laminate 10 together with the protection layer 12 is produced.

First, slurry is produced from a ceramic raw material powder such as lead zirconate titanate (PZT), like the slurry used for the green sheet 110. A green sheet is formed from the slurry. The formed green sheet is punched in a predetermined size, and an electrode material for the inner electrode is printed at a predetermined position.

The printed green sheet is punched in a final size, and the green sheets are laminated. The obtained laminate is pressed, and an electrically conductive paste for the side-surface electrode is coated on both side surfaces of the laminate. The laminate is sintered.

Thus, the intermediate laminate 100 (FIG. 6) formed by alternately laminating piezoelectric layers 11 from the green sheet and the inner electrode layers 21, 22 from the electrode material and provided with the side-surface electrodes 31 and 32 on the side surfaces 101 and 102 is produced.

An Ag/Pd alloy is used for the electrode material that forms the inner electrode layers 21 and 22, and for the conductive paste that forms the side-surface electrodes 31 and 32.

In the present example, a vanishing slit layer that vanishes by firing and a spacer layer for matching the print height are also printed at predetermined positions on the green sheet, like the green sheet used to form the protection layers 12. Therefore, the slits 19 are formed on the whole periphery of the side surfaces of the intermediate laminate 100 in the present example. The slits 19 are provided at the intermediate part of the intermediate laminate 100 in the lamination direction of the adjacent inner electrode layers 21 and 22.

Next, the protection layers 12 and the intermediate laminate 100 obtained are used to produce the laminated piezoelectric element 1.

Figure 6:
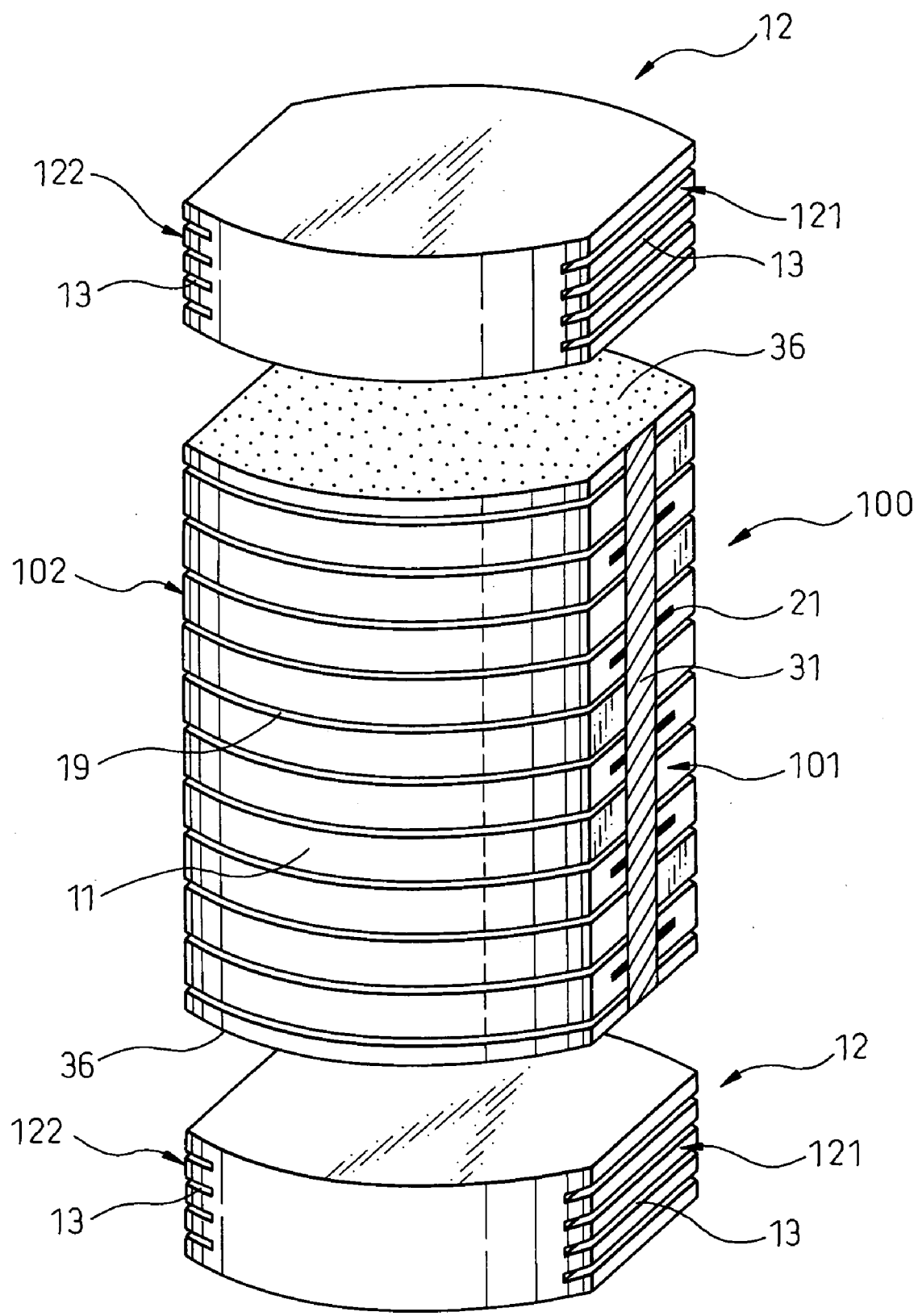
FIG. 6 is an explanatory diagram of a step of producing a ceramic laminate by connecting protection layers to an intermediate laminate according to Example 1.

First, as shown in FIG. 6, the protection layers 12 are connected to both ends of the intermediate laminate 100 provided with the side-surface electrodes 31 and 32, with the adhesive 36 in the lamination direction of the intermediate laminate 100, thereby obtaining the ceramic laminate 10.

Figure 7:
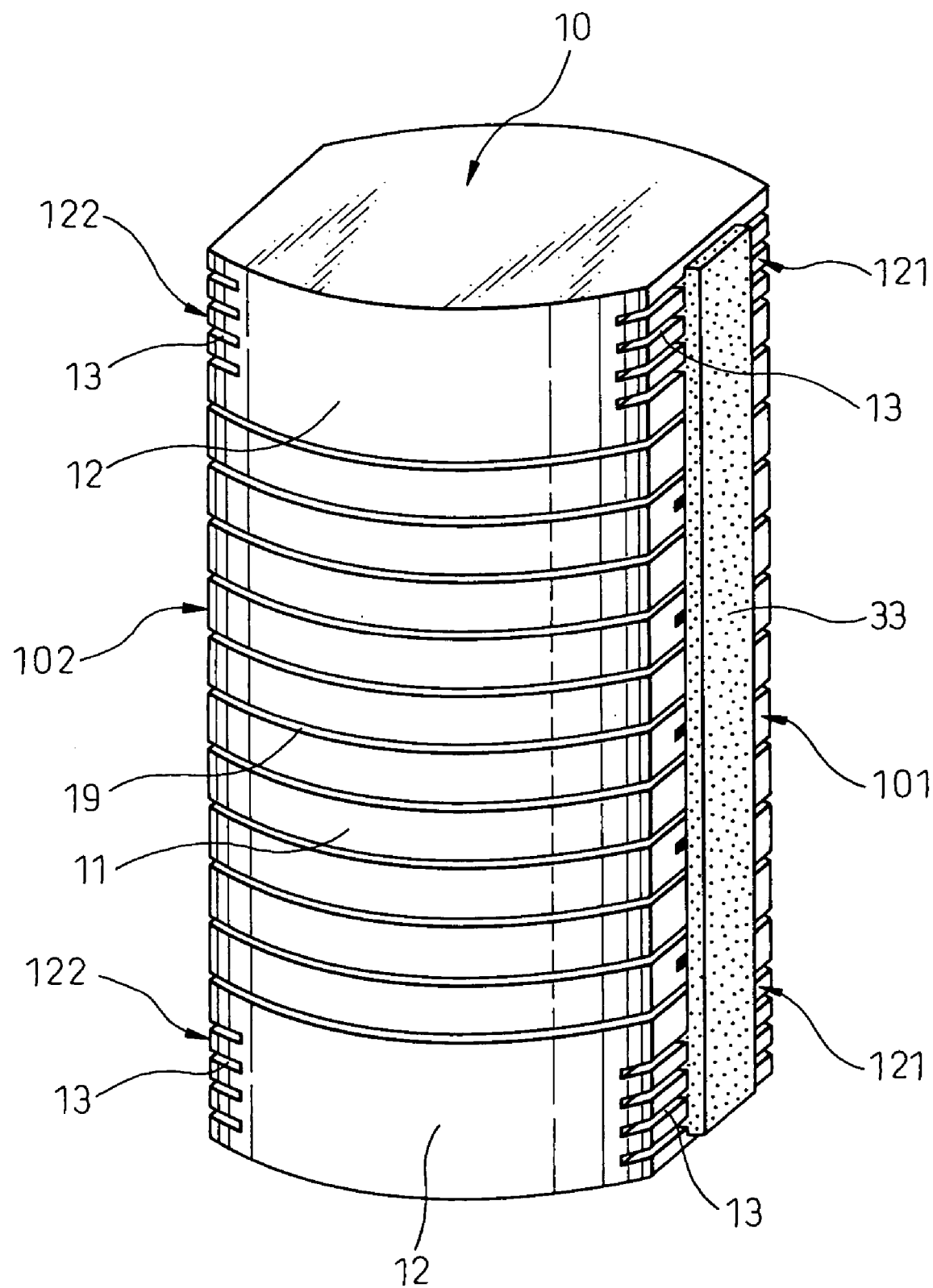
FIG. 7 is an explanatory diagram of a step of coating an electrically conductive adhesive according to Example 1.

Next, as shown in FIG. 7, the electrically conductive adhesive 33 is coated on the side-surface electrodes 31 and 32 and on the side surfaces of the protection layers 12. In this case, the electrically conductive adhesive 33 is coated on the side surfaces 121 and 122 of the protection layers 12 so as to fill the trenches 13.

Figure 8:
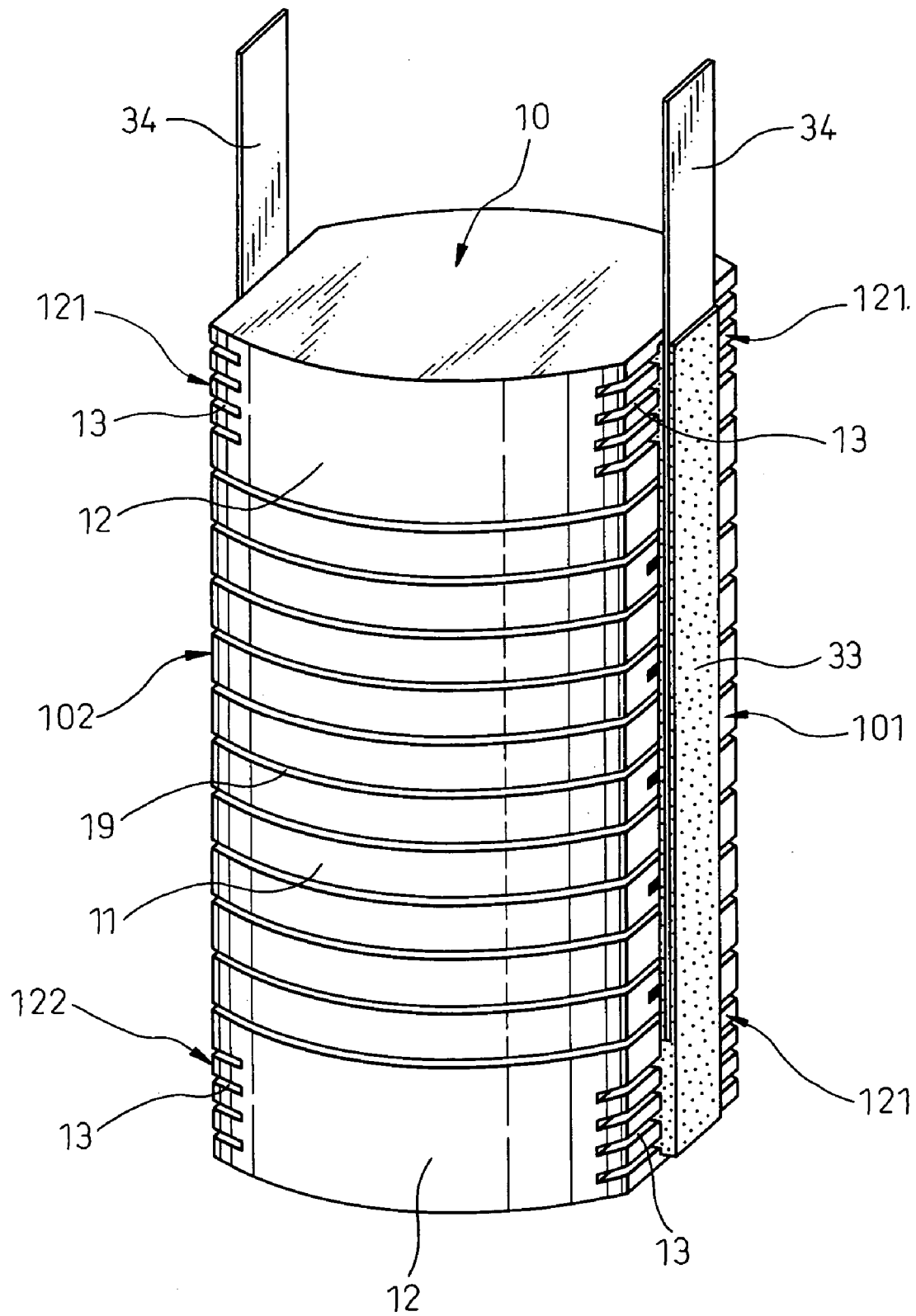
FIG. 8 is an explanatory diagram of a step of connecting external electrodes according to Example 1.

As shown in FIG. 8, the external electrodes 34 are embedded into the coated electrically conductive adhesive 33.

Figure 9:
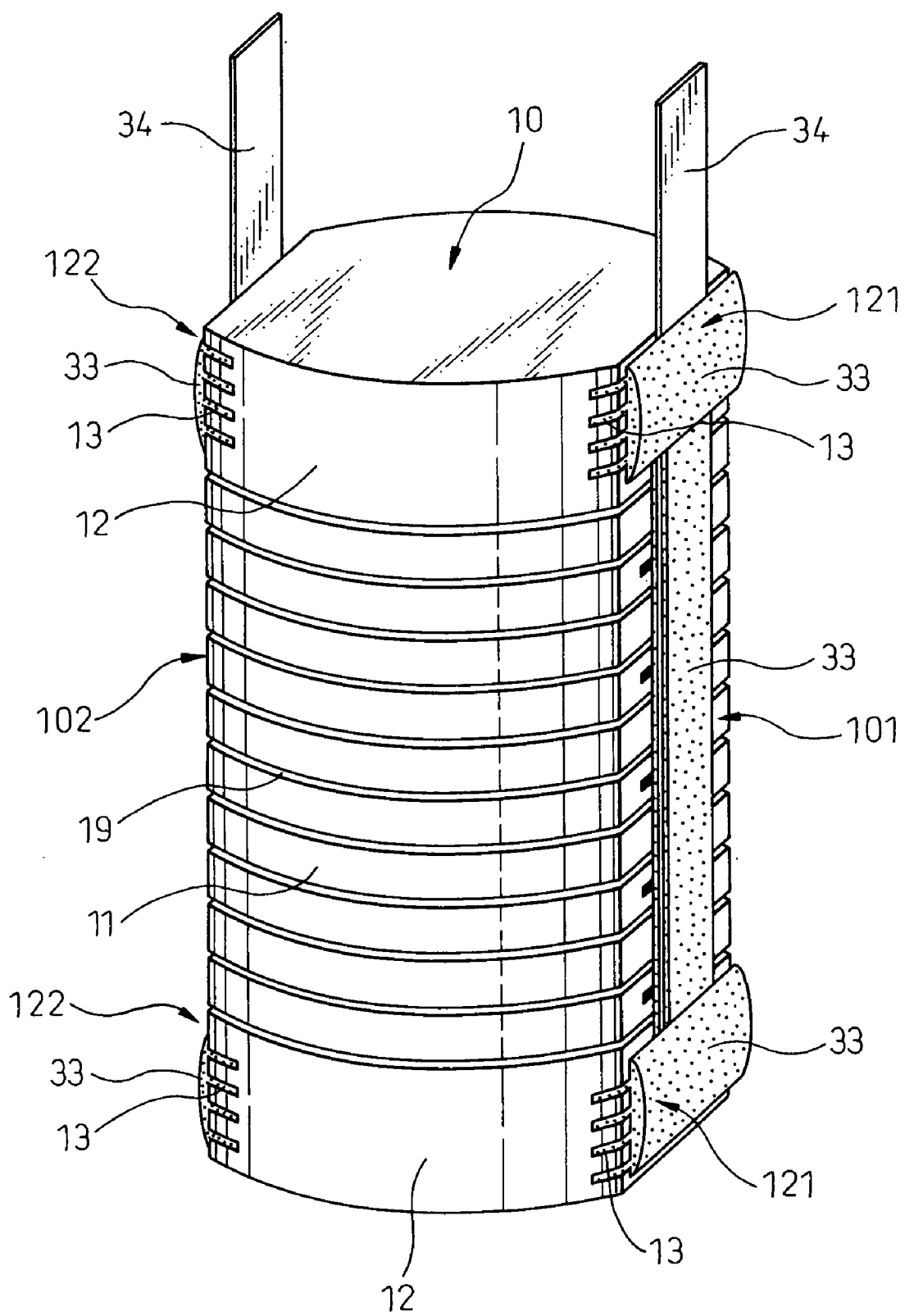
FIG. 9 is an explanatory diagram of a step of coating an electrically conductive adhesive to side surfaces of protection layers according to Example 1.

As shown in FIG. 9, the electrically conductive adhesive 33 is coated widely onto the side surfaces 121 and 122 of the protection layers 12 so that the electrically conductive adhesive 33 is filled into the whole trenches 13. This process can be omitted. The coated electrically conductive adhesive 33 is heated and cured, thereby connecting the external electrodes 34 to the ceramic laminate 10.

Figure 10:
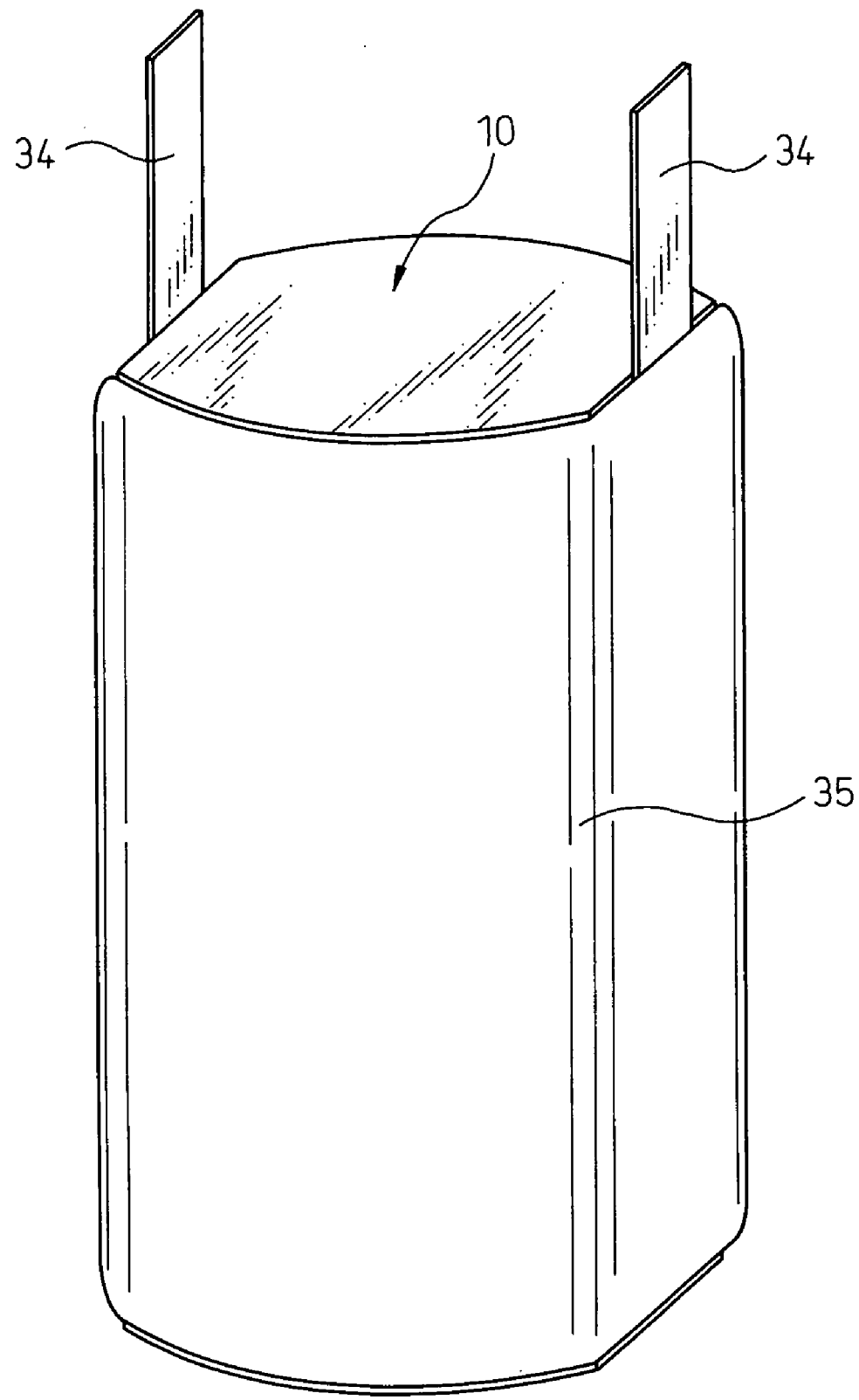
FIG. 10 is an explanatory diagram of a step of molding with a molding material according to Example 1.

Last, as shown in FIG. 10, the whole periphery of the side surfaces of the ceramic laminate 10 is molded with the molding material 35 made of a silicon resin as an insulating resin, thereby completing the laminated piezoelectric element 1 shown in FIG. 1.

In the present example, an epoxy resin as an insulating resin dispersed with Ag as conductive filler is used for the electrically conductive adhesive 33. For the insulating resin, various kinds of resins such as silicon, urethane, and polyimide can be also used in addition to the above epoxy resin. For the conductive filter, Cu and Ni can be also used in addition to Ag.

For the external electrodes 34, a meshed expander metal obtained by processing a metal plate is used. The expander metal has elasticity in the longitudinal direction. In addition to the above material, a punching metal and the like can be also used for the external electrodes 34.

Work effect of the laminated piezoelectric element in the present example is explained next.

The laminated piezoelectric element 1 in the present example has the protection layers 12 of ceramics formed at both ends of the ceramic laminate 10 in the lamination direction. One or more trenches 13 recessed inward are formed on the side surfaces 121 and 122 of the protection layers 12. The electrically conductive adhesive 33 is filled in at least a part of the trenches 13.

Because the electrically conductive adhesive 33 is filled in the trenches 13 formed on the side surfaces 121 and 122 of the protection layer 12, adhesiveness between the protection layer 12 and the electrically conductive adhesive 33 can be improved based on the anchor effect. Therefore, the electrically conductive adhesive 33 has adhesive strength that can bear the stress generated by the voltage displacement. Consequently, the peeling off does not occur easily. In other words, the protection layer 12 can suppress the peeling off of the electrically conductive adhesive 33.

With the above arrangement, the laminated piezoelectric element 1 formed with the protection layers 12 having the above configuration can suppress the peeling off of the electrically conductive adhesive 33. As a result, the laminated piezoelectric element 1 exhibits sufficient durability during a long-term use, and can obtain high reliability.

The protection layers 12 are formed at both ends of the ceramic laminate 10 in a lamination direction where larger stress is applied than that applied to other parts due to a piezoelectric displacement. Therefore, the protection layers 12 can exhibit more sufficiently the effect of suppressing the peeling off of the electrically conductive adhesive 33.

In the present example, the protection layers 12 are made of the same piezoelectric material as that of the piezoelectric layer 11. Therefore, the size of the sintered protection layers 12 and the size of the cross section of the intermediate laminate 100 can be easily made approximately the same. At the same time, the shape precision of the ceramic laminate 10 can be improved.

The electrically conductive adhesive 33 is widely coated on the side surfaces 121 and 122 of the protection layers 12. Therefore, the electrically conductive adhesive 33 are filled in the whole trenches 13. This can further suppress the peeling off of the electrically conductive adhesive 33. Even when this process is omitted, the peeling off of the electrically conductive adhesive 33 can be sufficiently suppressed.

The ceramic laminate 10 has the slits 19 at an intermediate part of the ceramic laminate 10 in the lamination direction of the adjacent inner electrodes 21 and 22. These slits 19 are formed on the whole periphery of the side surfaces of the ceramic laminate. Because these slits 19 can mitigate stress generated due to a piezoelectric displacement, the peeling off of the electrically conductive adhesive 33 and crack in the piezoelectric layer 11 can be suppressed. Consequently, durability and reliability of the whole laminated piezoelectric element 1 can be improved.

As explained above, according to the present example, it is possible to provide a laminated piezoelectric element that can suppress the peeling off of the electrically conductive adhesive and has excellent durability and high reliability, and a method of manufacturing the laminated piezoelectric element.

In the present example, while the protection layers 12 are made of the same piezoelectric material as that of the piezoelectric layer 11, the protection layers 12 can be also made of a material different from that of the piezoelectric layer 11. However, it is preferable that the size of the sintered protection layers 12 and the size of the cross section of the intermediate laminate 100 including the piezoelectric layer 11 are approximately the same.

The intermediate laminate 100 can be produced by preparing plural units, and then connecting them together with an adhesive.

In producing the ceramic laminate 10, the protection layers 12 and the intermediate laminate 100 are sintered separately, and thereafter, these are integrated together with the adhesive 36. Alternately, after both the protection layers 12 and the intermediate laminate 100 are laminated together in the state of a green sheet, these can be sintered.

While the trenches 13 are formed on both protection layers 12 at both ends of the ceramic laminate 10, the trenches 13 can be also formed on only one side.

Example 2

Figure 11:
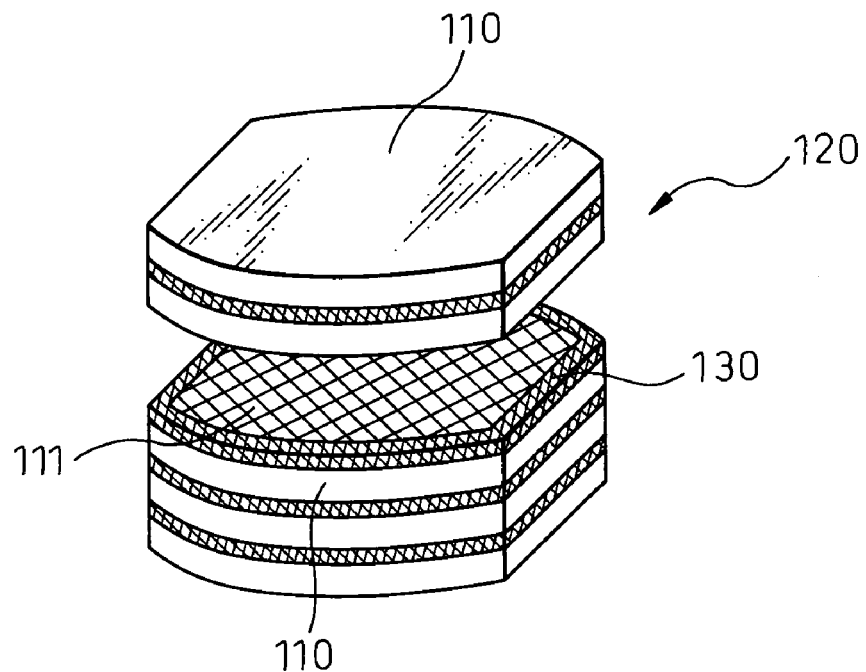
FIG. 11 is an explanatory diagram of a step of printing on green sheets, and laminating the green sheets according to Example 2.
Figure 12:
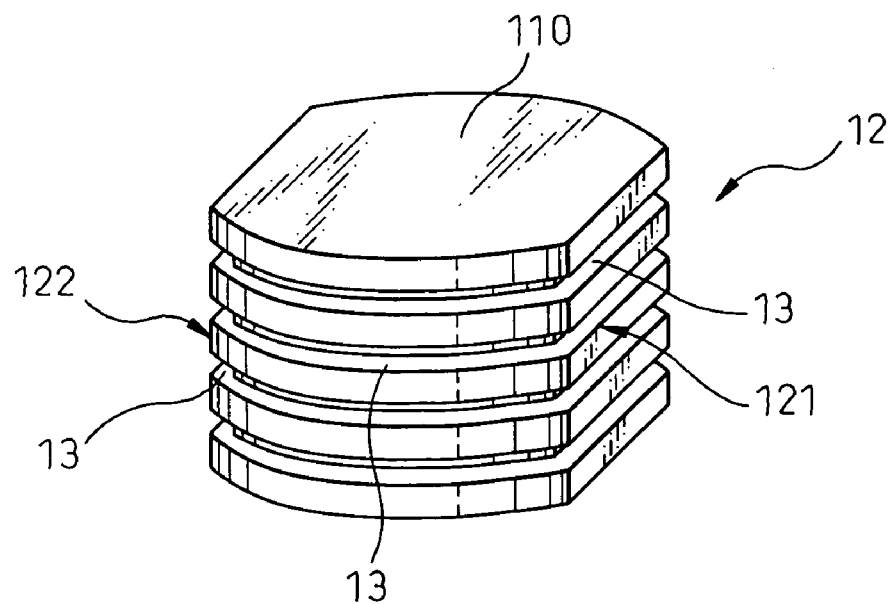
FIG. 12 is an explanatory diagram of a configuration of a protection layer on the whole peripheral side surface of which trenches are formed according to Example 2.

According to Example 2, the trenches 13 are formed on the whole periphery of the side surfaces of the protection layers, as shown in FIG. 11 and FIG. 12.

In the present example, at the printing step, the vanishing slit layers 130 are printed on the external periphery of the green sheet 110, and the spacer layer 111 is printed on the part of the green sheet 110 not printed with the vanishing slit layer 130, as shown in FIG. 11. Thereafter, the protection layer 12 is formed in the same process as that of Example 1.

As a result, the trenches 13 are formed on the whole periphery of the side surfaces of the protection layer 12 obtained, as shown in FIG. 12.

Other parts are formed in the same manner as that explained in Example 1.

In this case, among the trenches 13 formed on the whole periphery of the side surfaces of the protection layer 12, the electrically conductive adhesive 33 is filled into the trenches 13 formed on the side surfaces 121 and 122. The molding material 35 is filled into the trenches 13 formed on other parts. Therefore, the adhesiveness between the molding material 35 and the ceramic laminate 10 is improved, and the adhesive strength of the electrically conductive adhesive 33 molded by the molding material 35 is increased.

Other parts have the same work effect as that of parts according to Example 1.

Example 3

Figure 13:
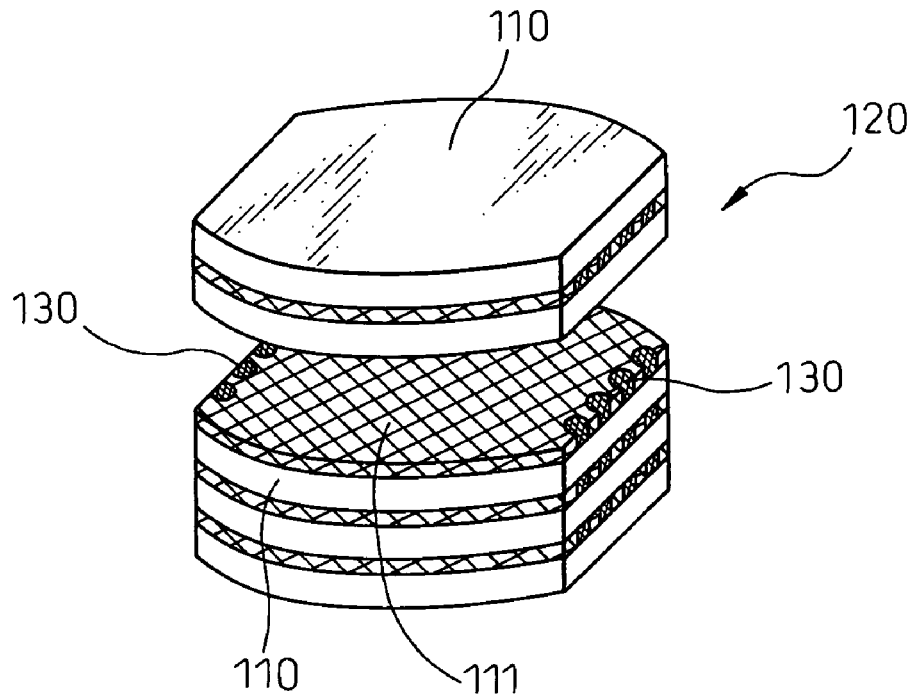
FIG. 13 is an explanatory diagram of a step of printing on green sheets, and laminating the green sheets according to Example 3.
Figure 14:
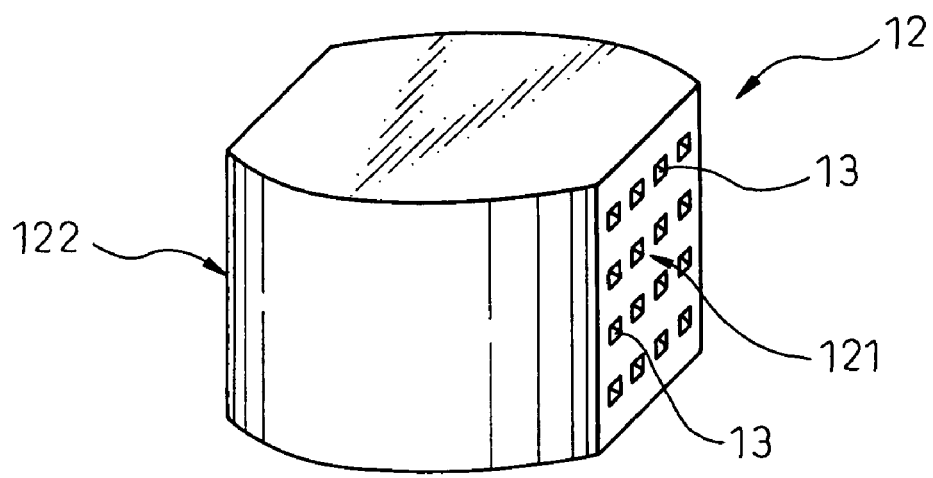
FIG. 14 is an explanatory diagram of a configuration of a protection layer on side surfaces of which trenches are formed intermittently according to Example 3.

According to Example 3, the trenches 13 are intermittently formed on the side surfaces 121 and 122 of the protection layer 12, as shown in FIG. 13 and FIG. 14.

In the present example, at the printing step, the vanishing slit layers 130 are intermittently printed on the external periphery of the green sheet 110 formed by linear outlines. In this case, a size of at least a part of the internal width of the printed vanishing layers 130 is set larger than a size of the external width of the printed vanishing slit layers 130. The spacer layer 111 is printed on the part of the green sheet 110 where the vanishing slit layers 130 are not printed. Thereafter, the protection layer 12 is formed in the same process as that of Example 1.

As a result, the trenches 13 are formed intermittently on the side surfaces 121 and 122 of the protection layer 12 obtained, as shown in FIG. 14.

Other parts are formed in the same manner as that explained in Example 1.

In this case, the trenches 13 are formed intermittently, and a size of at least a part of the internal width of the trench 13 is larger than a size of the width of an opening exposed to the side surfaces 121 and 122 of the protection layer 12. Therefore, when the electrically conductive adhesive 33 is filled into the trenches 13, the anchor effect becomes large, and the adhesive strength of the electrically conductive adhesive 33 can be further improved.

Other parts have the same work effect as that of parts according to Example 1.

Figure 15:
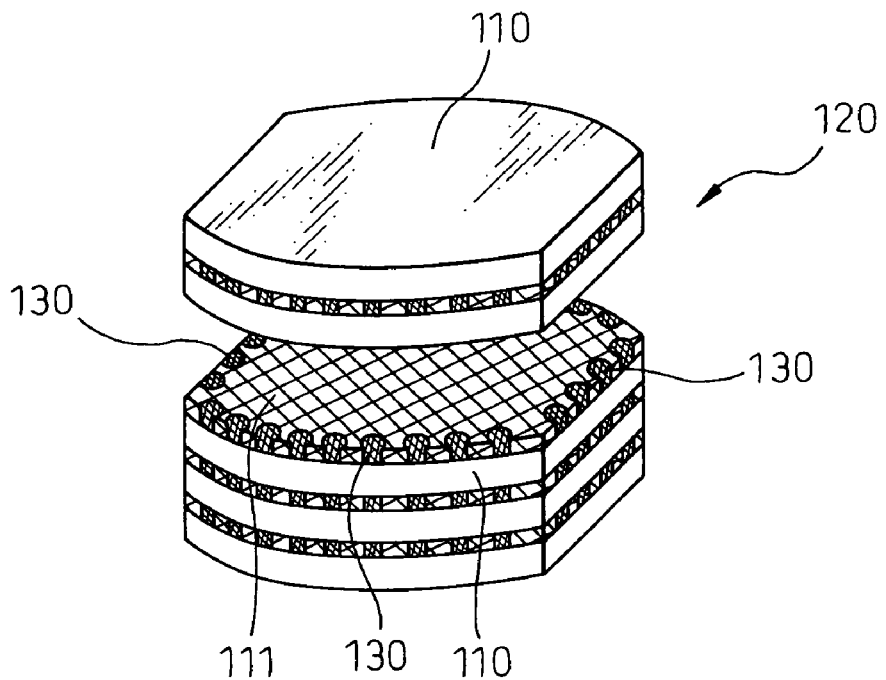
FIG. 15 is an explanatory diagram of a step of printing on green sheets, and laminating the green sheets according to Example 3.
Figure 16:
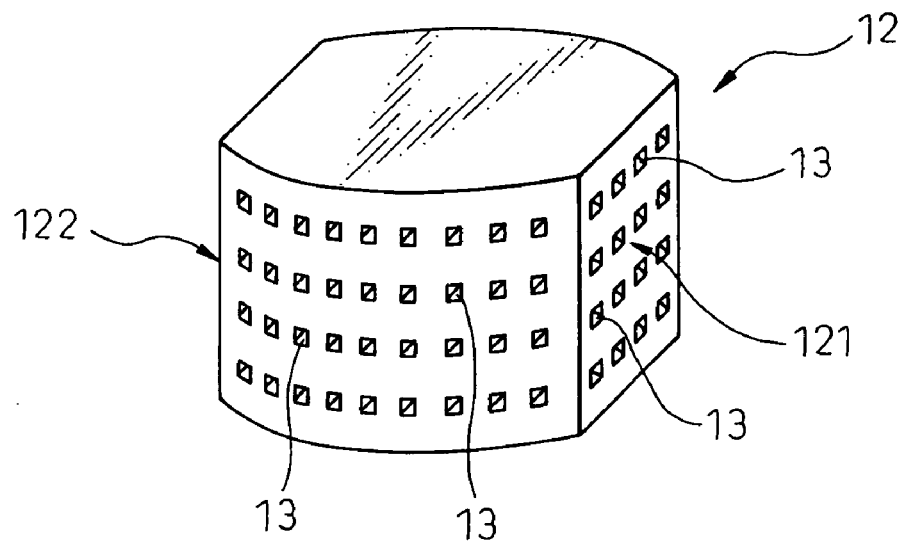
FIG. 16 is an explanatory diagram of a configuration of a protection layer on the whole peripheral side surfaces of which trenches are formed intermittently according to Example 3.

In the present example, the trenches 13 can be also formed intermittently on the whole periphery of the side surfaces of the protection layer 12, as shown in FIG. 15 and FIG. 16. In this case, in addition to the above work effect, the work effect according to Example 2 can be also obtained.

Example 4

Figure 17:
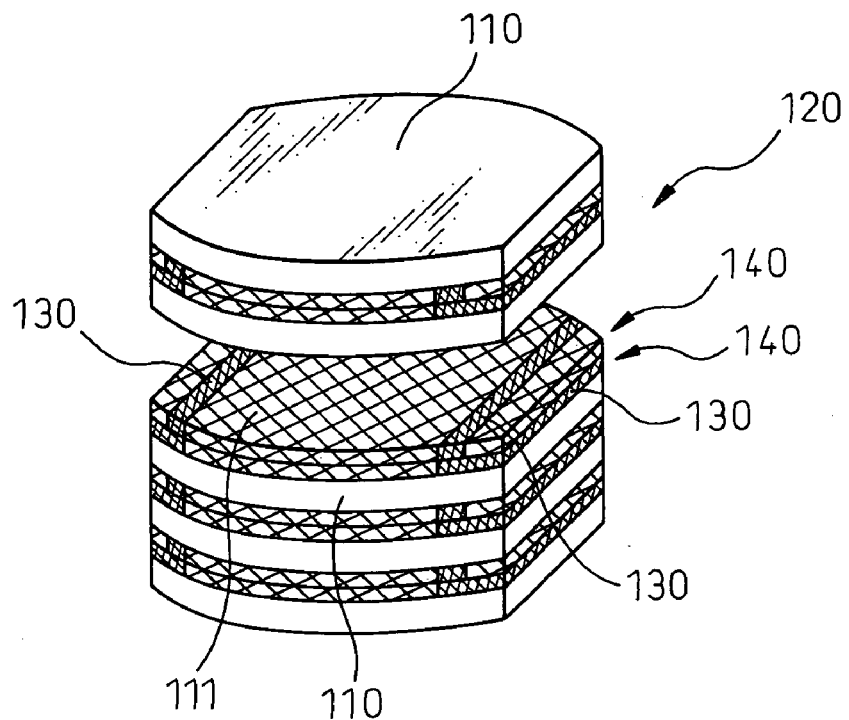
FIG. 17 is an explanatory diagram of a step of printing on green sheets, and laminating the green sheets according to Example 4.
Figure 18:
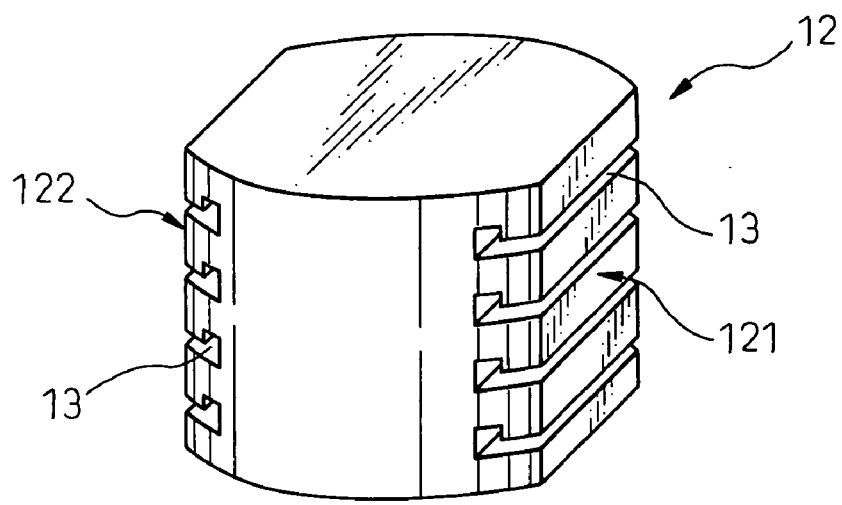
FIG. 18 is an explanatory diagram of a configuration of a protection layer on side surfaces of which L-shaped trenches are formed according to Example 4.

According to Example 4, L-shaped trenches 13 are formed on the side surfaces 121 and 122 of the protection layer 12, as shown in FIG. 17 and FIG. 18.

In the present example, two print layers 140 are formed on the green sheet 110 at the printing step, as shown in FIG. 17. On each printing layer 140, the vanishing slit layer 130 and the spacer layer 111 are printed at a predetermined position. Thereafter, the protection layer 12 is formed in the same process as that of Example 1.

As a result, the L-shaped trenches 13 are formed on the side surfaces 121 and 122 of the obtained protection layer 12 as shown in FIG. 18.

Other parts are formed in the same manner as that explained in Example 1.

In this case, the trenches 13 are formed in the L-shape, and a size of at least a part of the internal width of the trench 13 is larger than a size of the width of an opening exposed to the side surfaces 121 and 122 of the protection layer 12. Therefore, when the electrically conductive adhesive 33 is filled into the trenches 13, the anchor effect becomes larger, and the adhesive strength of the electrically conductive adhesive 33 can be further improved.

Other parts have the same work effect as that of parts according to Example 1.

Figure 19:
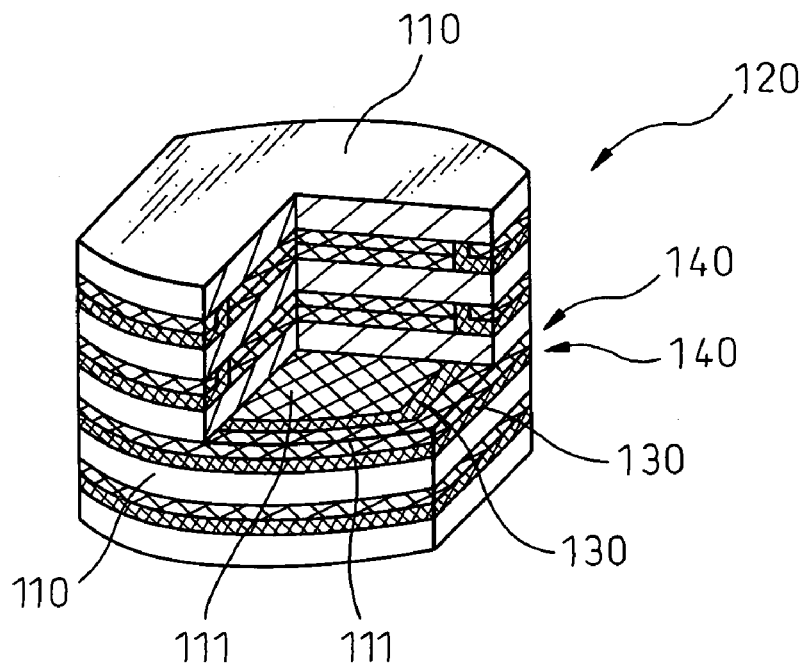
FIG. 19 is an explanatory diagram of a step of printing on green sheets, and laminating the green sheets according to Example 4.
Figure 20:
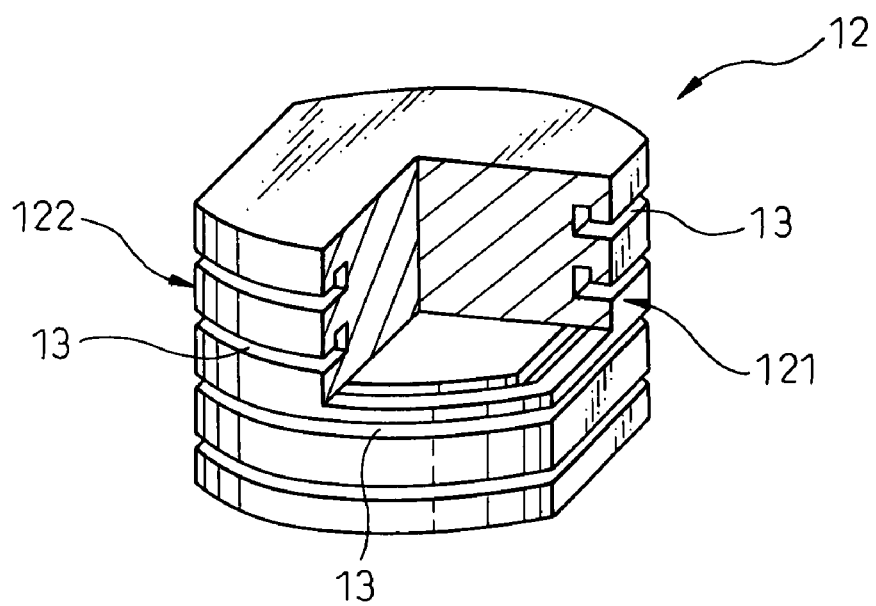
FIG. 20 is an explanatory diagram of a configuration of a protection layer on the whole side surfaces of which L-shaped trenches are formed according to Example 4.

In the present example, the L-shaped trenches 13 can be also formed on the whole periphery of the side surfaces of the protection layer 12, as shown in FIG. 19 and FIG. 20. In this case, in addition to the above work effect, the work effect according to Example 2 can be also obtained.

Example 5

Figure 21:
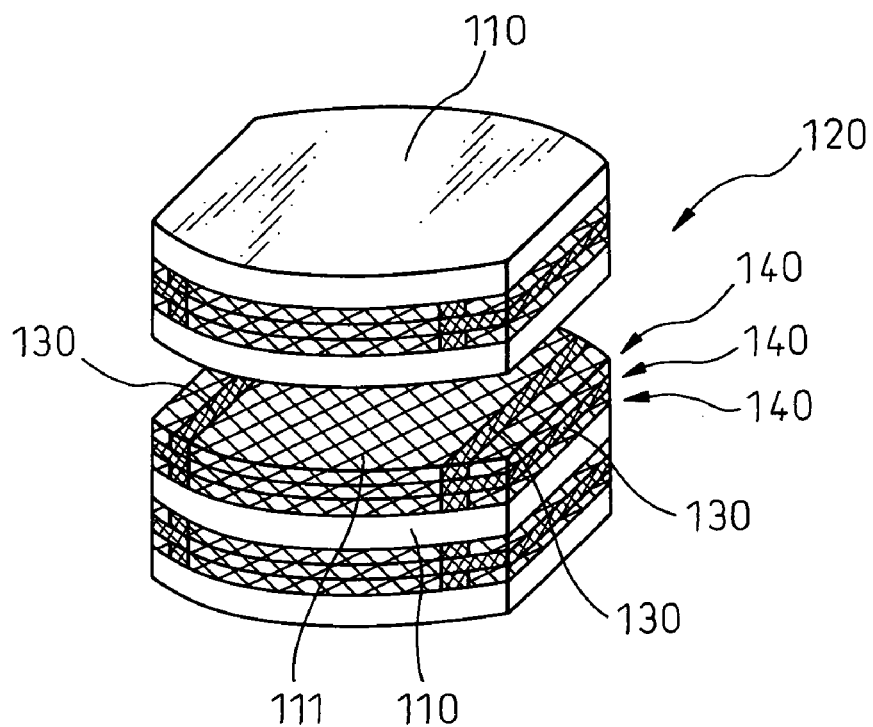
FIG. 21 is an explanatory diagram of a step of printing on green sheets, and laminating the green sheets according to Example 5.
Figure 22:
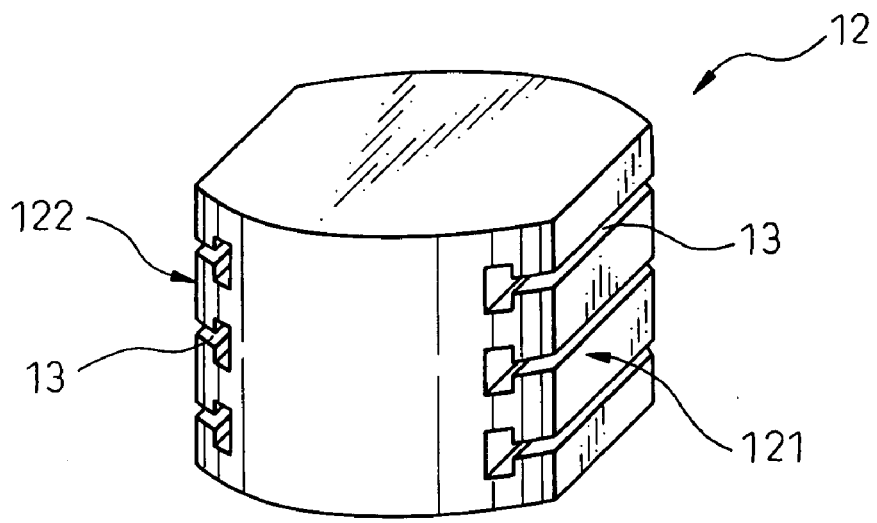
FIG. 22 is an explanatory diagram of a configuration of a protection layer on side surfaces of which T-shaped trenches are formed according to Example 5.

According to Example 5, T-shaped trenches 13 are formed on the side surfaces 121 and 122 of the protection layer 12, as shown in FIG. 21 and FIG. 22.

In the present example, three print layers 140 are formed on the green sheet 110 at the printing step, as shown in FIG. 21. On each printing layer 140, the vanishing slit layer 130 and the spacer layer 111 are printed at a predetermined position. Thereafter, the protection layer 12 is formed in the same process as that of Example 1.

As a result, the T-shaped trenches 13 are formed on the side surfaces 121 and 122 of the protection layer 12 obtained, as shown in FIG. 22.

Other parts are formed in the same manner as that explained in Example 1.

In this case, the trenches 13 are formed in the T-shape, and a size of at least a part of the internal width of the trench 13 is larger than a size of the width of an opening exposed to the side surfaces 121 and 122 of the protection layer 12. Therefore, when the electrically conductive adhesive 33 is filled into the trenches 13, the anchor effect becomes larger, and the adhesive strength of the electrically conductive adhesive 33 can be further improved.

Other parts have the same work effect as that of parts according to Example 1.

Figure 23:
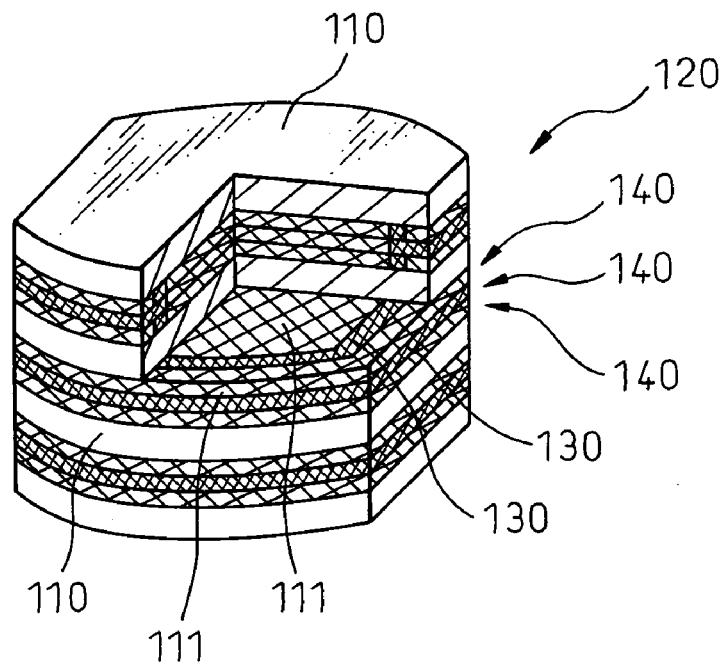
FIG. 23 is an explanatory diagram of a step of printing on green sheets, and laminating the green sheets according to Example 5.
Figure 24:
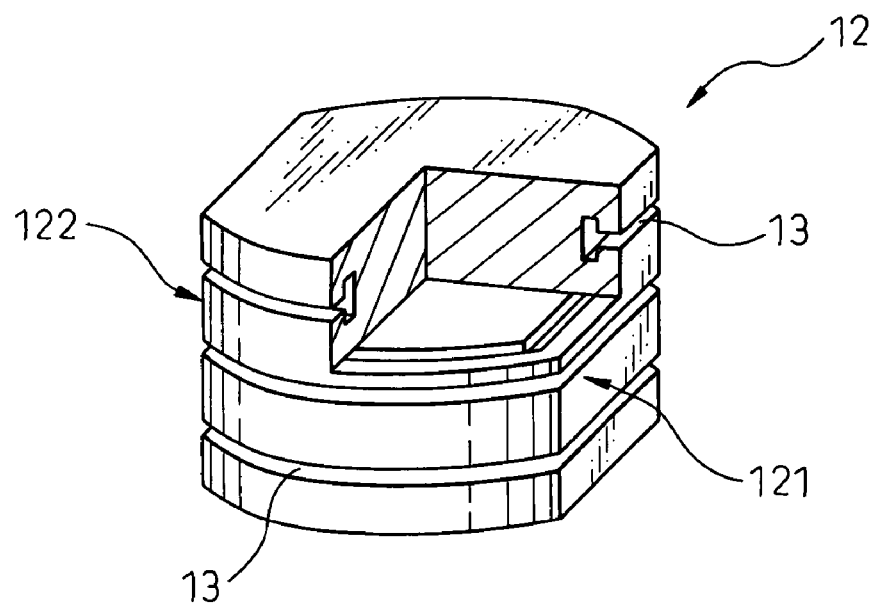
FIG. 24 is an explanatory diagram of a configuration of a protection layer on the whole side surfaces of which T-shaped trenches are formed according to Example 5.

In the present example, the T-shaped trenches 13 can be also formed on the whole periphery of the side surfaces of the protection layer 12, as shown in FIG. 23 and FIG. 24. In this case, in addition to the above work effect, the work effect according to Example 2 can be also obtained.

Example 6

Figure 25:
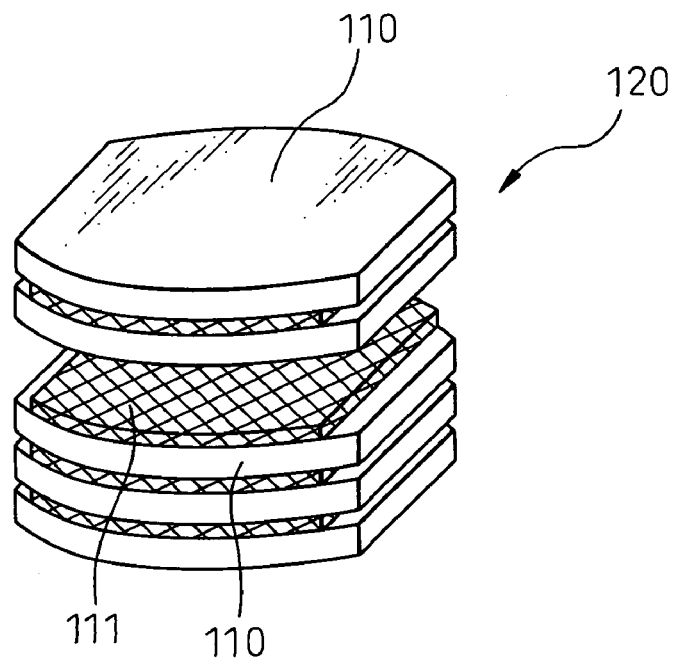
FIG. 25 is an explanatory diagram of a step of printing on green sheets, and laminating the green sheets according to Example 6.

According to Example 6, the trenches 13 are provided in the protection layer 12 without printing the vanishing slit layers 130, in the formation of the protection layer 12 in Example 1, as shown in FIG. 25.

In the present example, only the spacer layer 111 is formed on the portion of the green sheet 110 excluding the external peripheral part formed by a linear outline, at the printing step, as shown in FIG. 25. Thereafter, the protection layer 12 is formed in the same process as that of Example 1.

As a result, protection layers similar to the protection layers 12 as shown in FIG. 5 are obtained.

Other parts have configurations and work effect similar to those according to Example 1.

Figure 26:
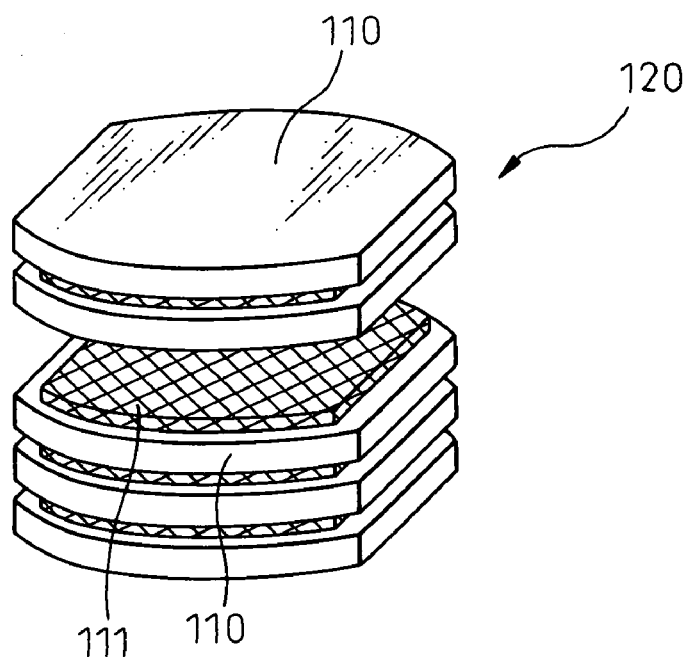
FIG. 26 is an explanatory diagram of a step of printing on green sheets, and laminating the green sheets according to Example 6.

In the present example, the protection layer 12 can be formed by printing only the spacer layer 111 on the portion of the green sheet 110 excluding the external peripheral part, at the printing step, as shown in FIG. 26. In this case, a protection layer similar to the protection layer according to Example 2 as shown in FIG. 12 is obtained.

Other parts have configurations and work effect similar to those according to Example 2.

Example 7

According to Example 7, the external electrodes 34 and their connection positions are changed in the ceramic laminate 10 according to Example 1, as shown in FIG. 27 to FIG. 30.

Figure 27:
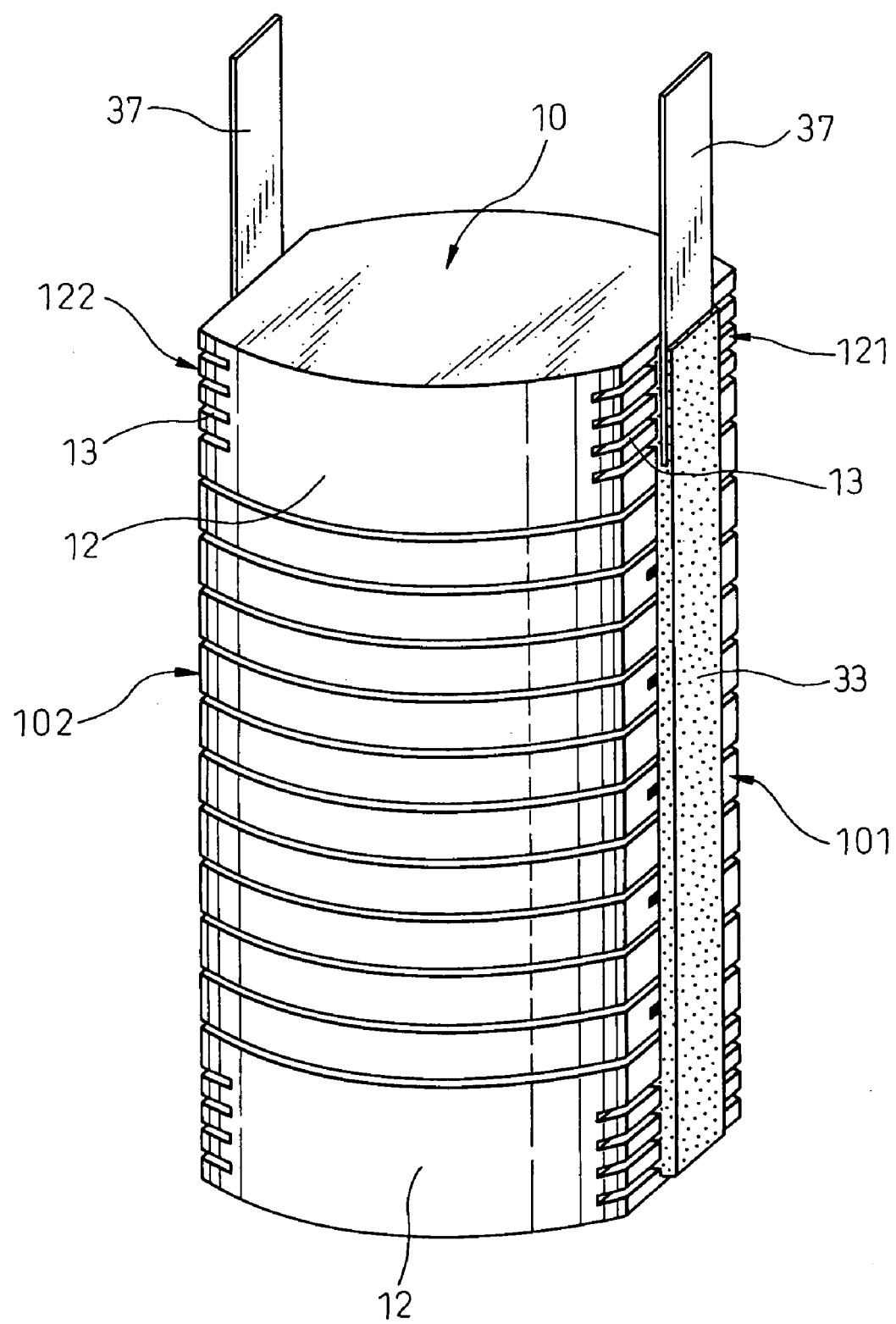
FIG. 27 is an explanatory diagram of a step of connecting external electrodes according to Example 7.
Figure 28:
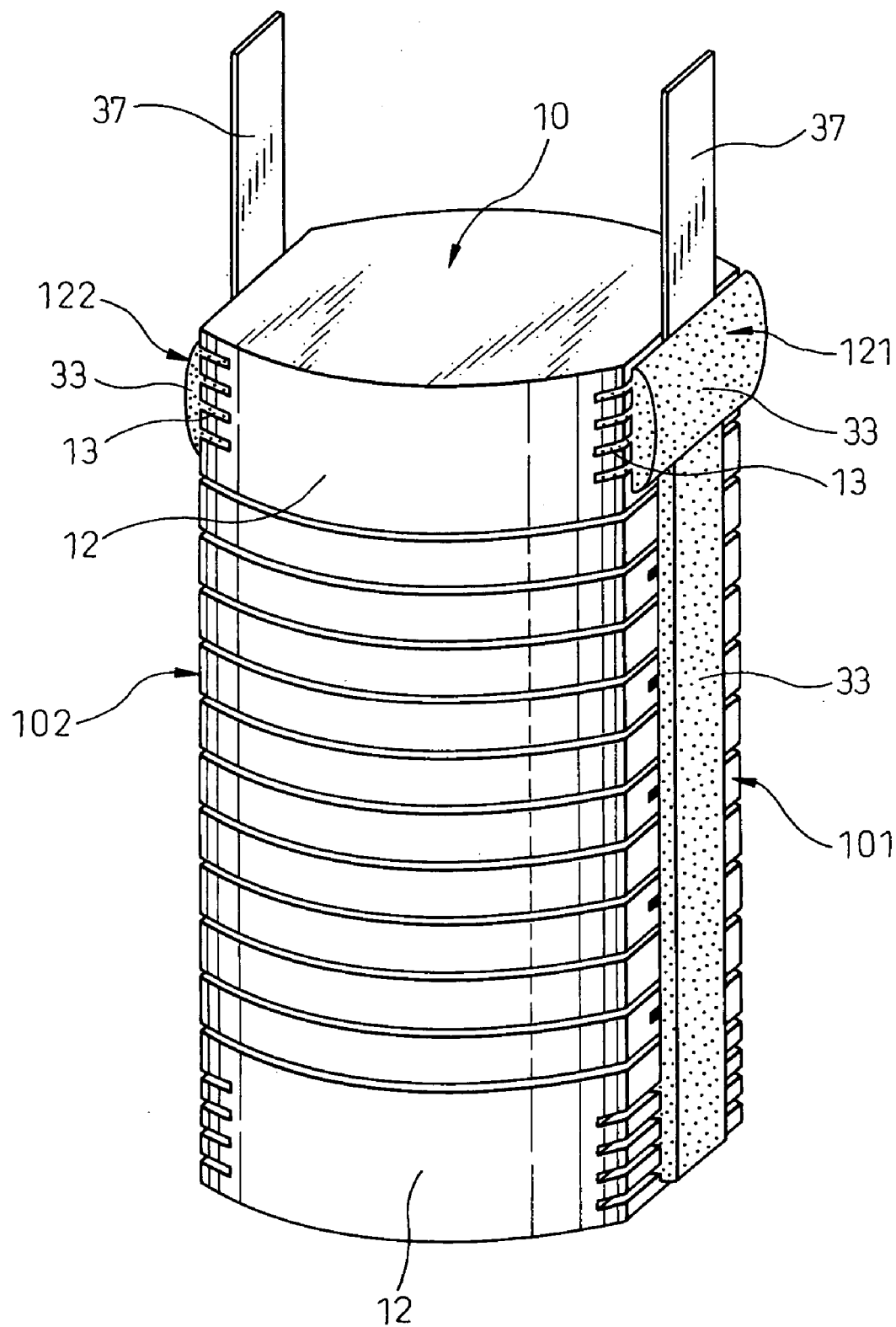
FIG. 28 is an explanatory diagram of a step of coating an electrically conductive adhesive to side surfaces of an upper-end protection layer according to Example 7.

FIG. 27 and FIG. 28 show an example of using the external electrodes 37 of the same material as that of the external electrodes 34 and having a smaller length than that of the external electrodes 34. The external electrodes 37 are connected to the upper side surfaces of the ceramic laminate 10.

As shown in FIG. 27, the electrically conductive adhesive 33 is coated onto the side surfaces 101 and 102 of the ceramic laminate 10. Then, the end parts of the external electrodes 34 are disposed on the upper part of the side surfaces of the ceramic laminate 10, that is, the side surfaces 121 and 122 of the upper protection layer 12. Thereafter, as shown in FIG. 28, the electrically conductive adhesive 33 is widely coated onto the side surface to cover the end part of the disposed external electrodes 37 as shown in FIG. 28. The electrically conductive adhesive 33 is heated and cured, thereby connecting the external electrodes 37 to the ceramic laminate 10.

Other parts have configurations similar to those according to Example 1.

Figure 29:
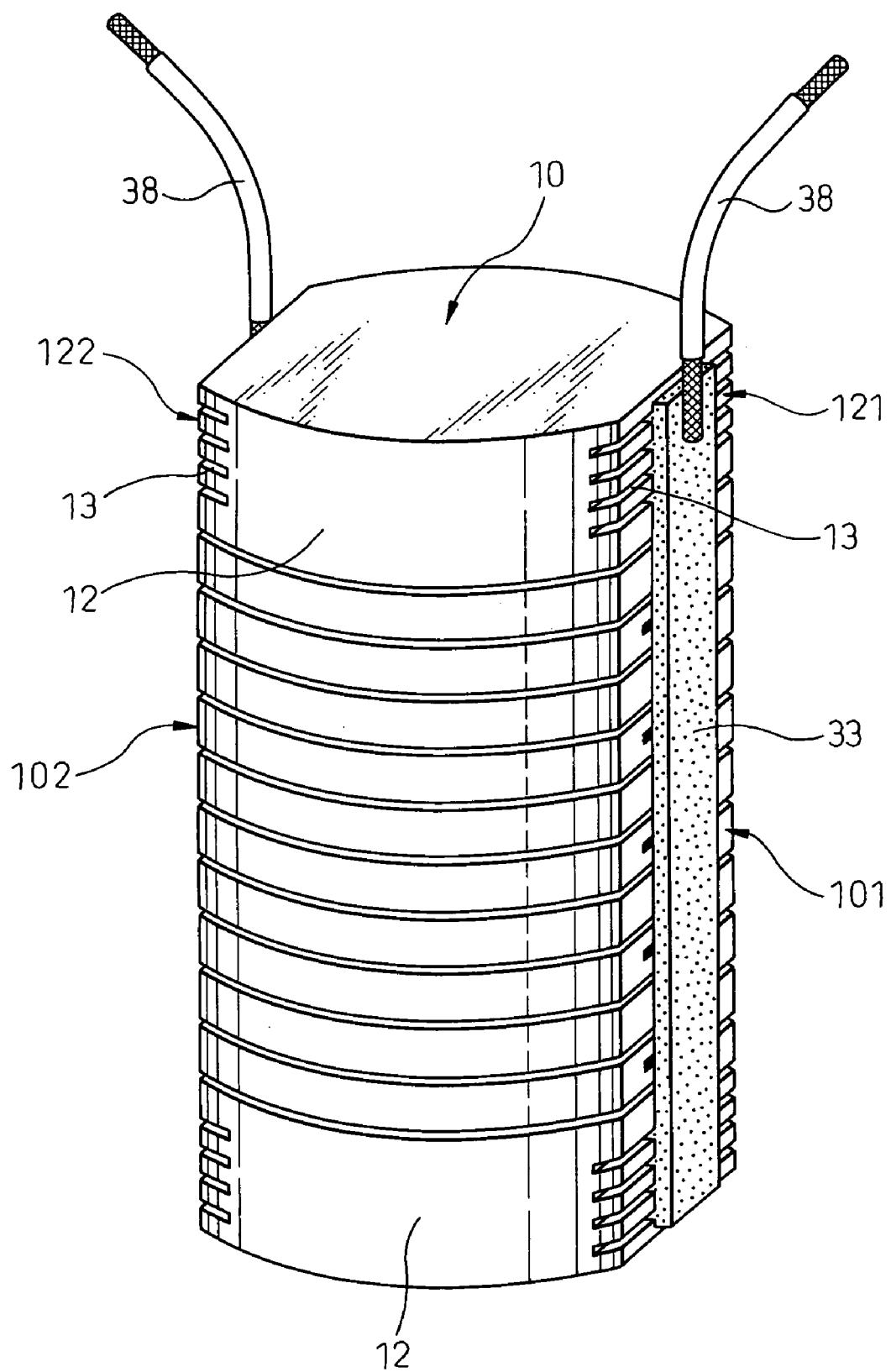
FIG. 29 is an explanatory diagram of a step of connecting lead wires according to Example 7.
Figure 30:
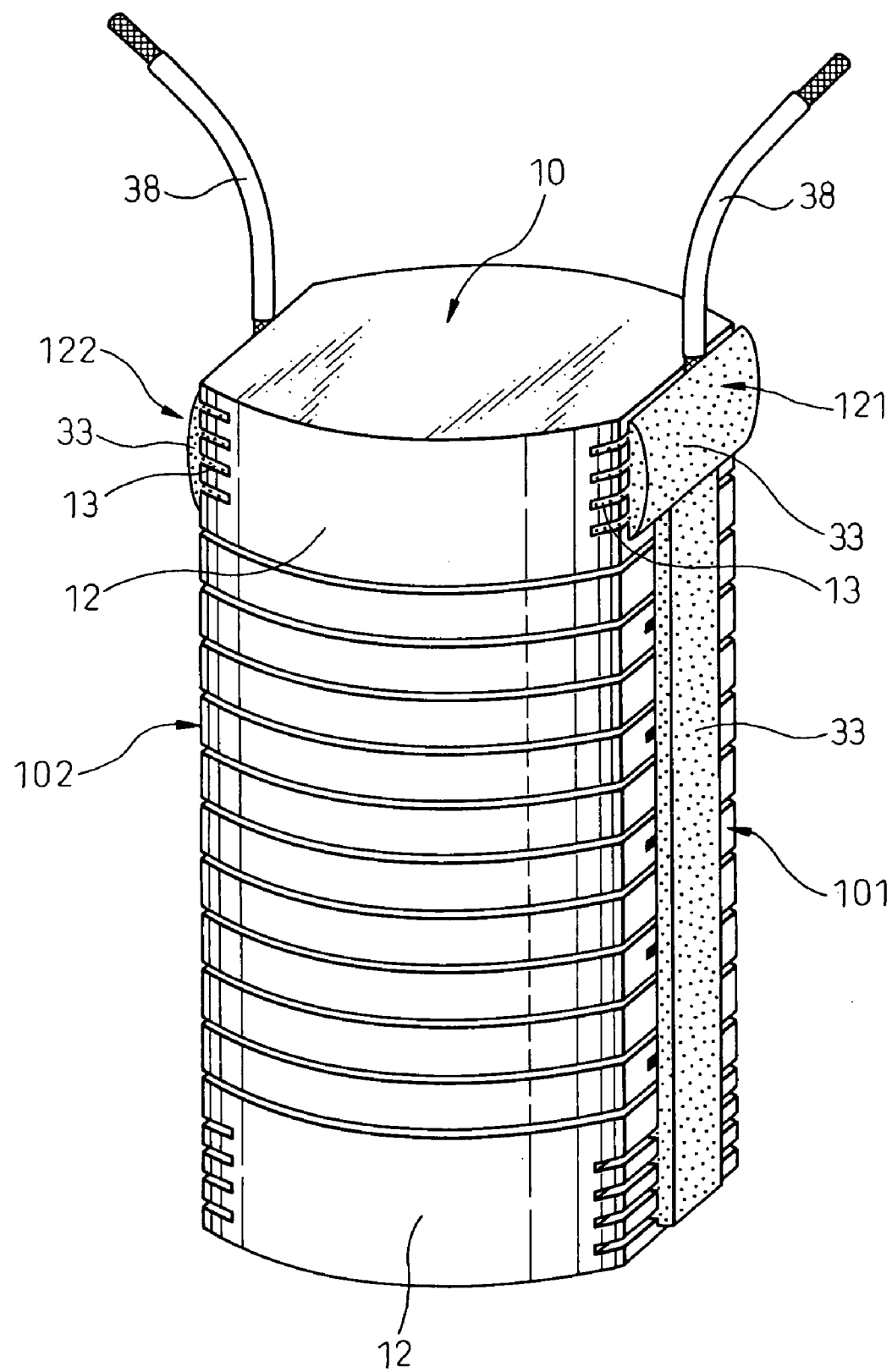
FIG. 30 is an explanatory diagram of a step of coating an electrically conductive adhesive to side surfaces of the upper-end protection layer according to Example 7.

FIG. 29 and FIG. 30 show an example of using lead wires 38 in place of the external electrodes 34 according to Example 1. The lead wires 38 are connected to the upper side surfaces of the ceramic laminate 10.

As shown in FIG. 29 and FIG. 30, the lead wires 38 are connected to the upper part of the side surfaces of the ceramic laminate 10 using a method similar to that described above.

Other parts have configurations similar to those according to Example 1.

In both examples, the external electrodes 37 and the lead wires 38 are connected to the side surfaces 121 and 122 of the protection layers 12 having high adhesive strength of the electrically conductive adhesive 33. Therefore, the external electrodes 37 and the lead wires 38 can be connected strongly.

Other parts have work effect similar to that according to Example 1.

Example 8

Figure 31:
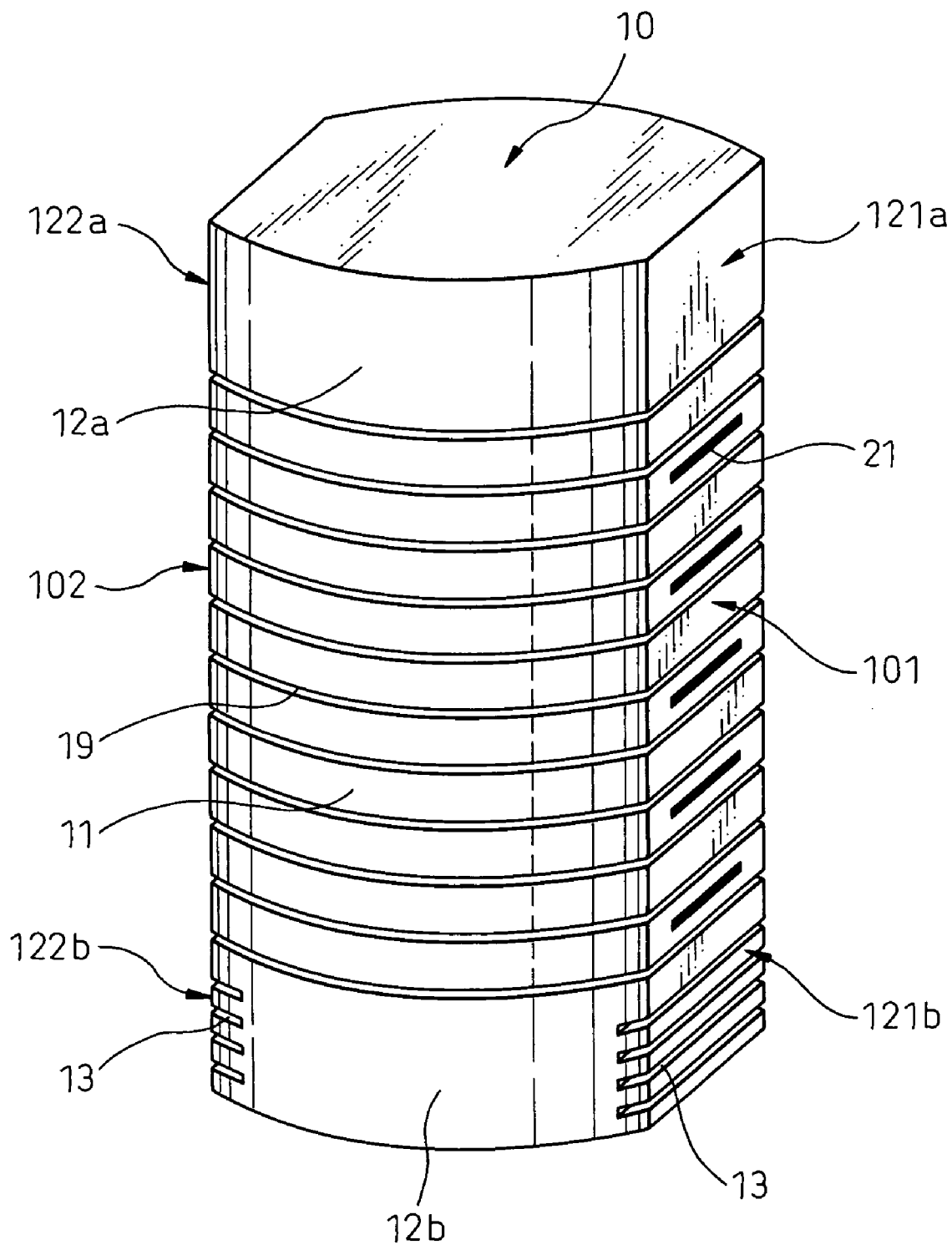
FIG. 31 is an explanatory diagram of a configuration of a ceramic laminate according to Example 8.

According to Example 8, the trenches 13 recessed inward are formed on only one protection layer 12b out of the protection layers (12a and 12b) formed at the upper end and the lower end of the ceramic laminate 10 in the lamination direction, as shown in FIG. 31.

In the present example, the upper-end protection layer 12a and the lower-end protection layer 12b of ceramics are formed at the upper end and the lower end respectively of the ceramic laminate 10 in the lamination direction, as shown in FIG. 31. Plural trenches 13 recessed inward are formed on side surfaces 121a and 121b of the lower-end protection layer 12b out of the protection layers 12a and 12b. On the other hand, no trench 13 is formed on the side surfaces 121a and 122a of the upper-end protection layer 12a.

Other parts have configurations similar to those according to Example 1.

A method of manufacturing the laminated piezoelectric element 1 according to the present example is explained below.

The upper-end protection layer 12a is produced by first laminating only plural green sheets 110 shown in FIG. 3, pressing the laminated, and sintering the pressed laminate. The lower-end protection layer 12b is produced using a method similar to that used to produce the protection layer 12 according to Example 1 as shown in FIG. 3 to FIG. 5.

The upper-end protection layer 12a and the lower-end protection layer 12b are adhered to both ends of the intermediate laminate 100 having the side-surface electrodes 31 and 32 provided on the side surfaces 101 and 102 respectively, thereby obtaining the ceramic laminate 10.

Figure 32:
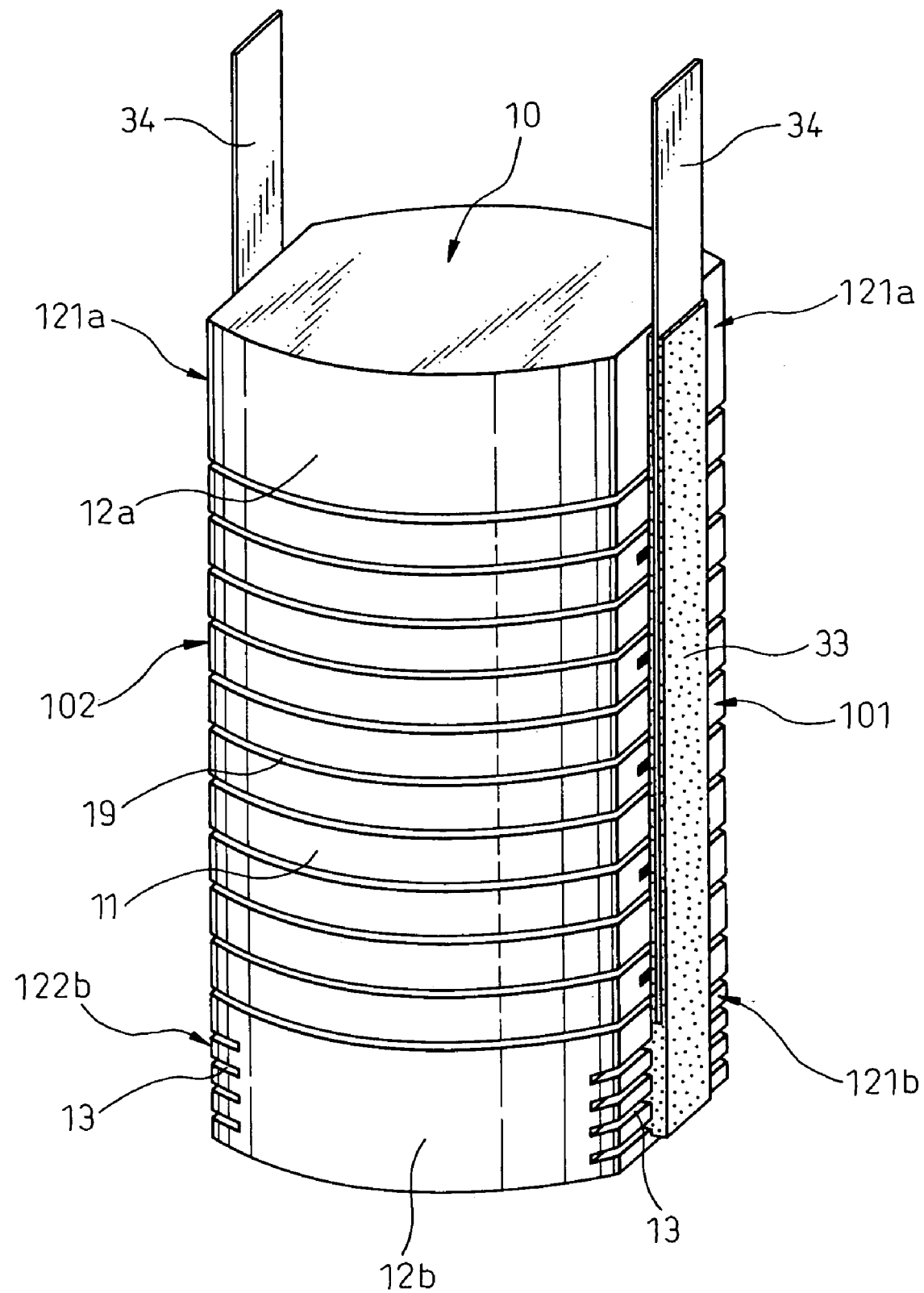
FIG. 32 is an explanatory diagram of a step of connecting external electrodes according to Example 8.

Next, as shown in FIG. 32, the electrically conductive adhesive 33 is coated on the side-surface electrodes 31 and 32 and on the side surfaces of the protection layers 12a and 12b. In this case, on the side surfaces 121b and 122b of the protection layer 12b, the electrically conductive adhesive 33 is coated so as to be filled into the trenches 13. The external electrodes 34 are disposed so as to be embedded into the coated electrically conductive adhesive 33.

Figure 33:
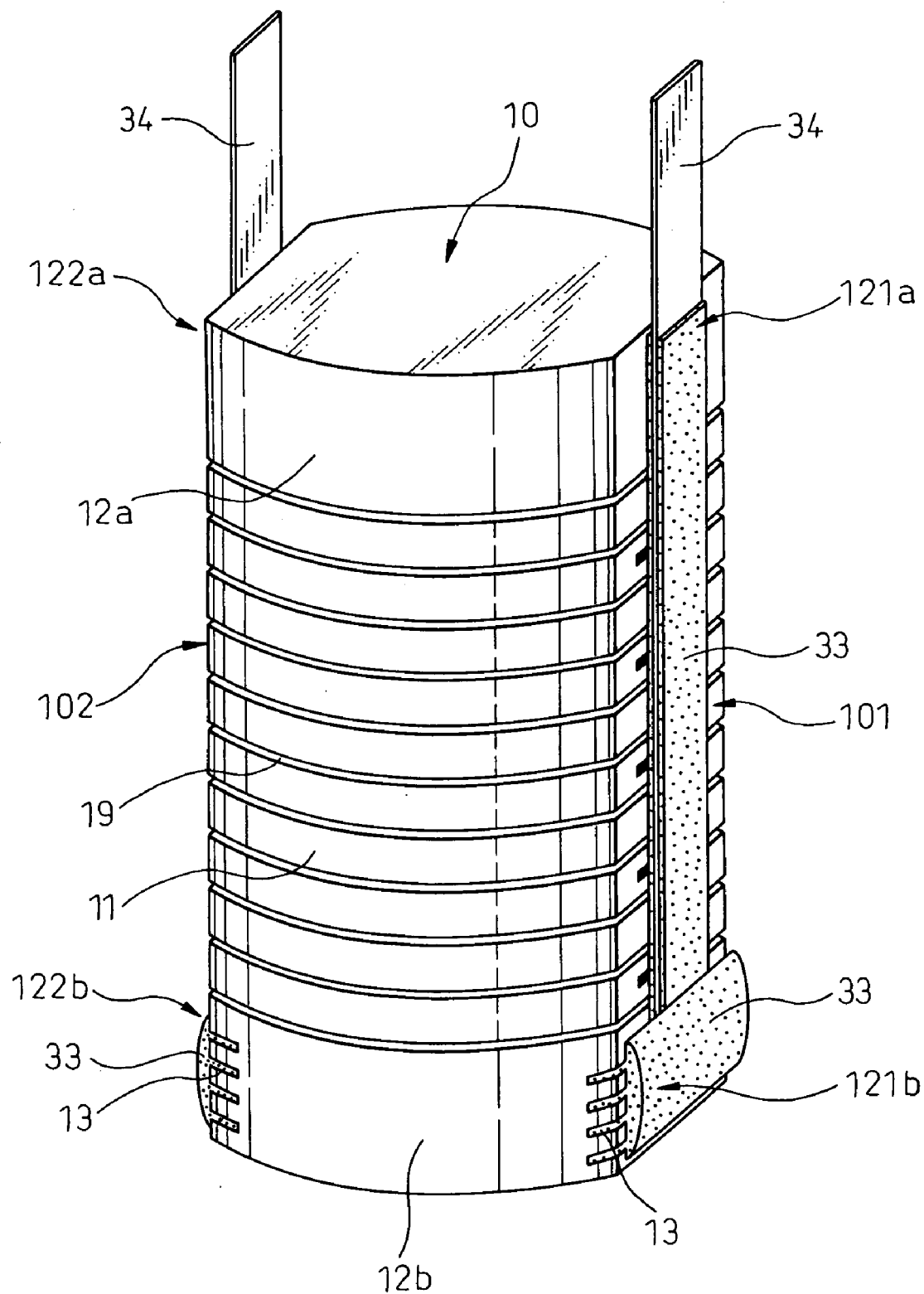
FIG. 33 is an explanatory diagram of a step of coating an electrically conductive adhesive to side surfaces of protection layers according to Example 8.

As shown in FIG. 33, the electrically conductive adhesive 33 is widely coated on the side surfaces 121b and 122b of the lower-end protection layer 12b so that the electrically conductive adhesive 33 is filled in the whole trenches 13 of the lower-end protection layer 12b. Thereafter, the coated electrically conductive adhesive 33 is heated and cured, thereby connecting the external electrodes 34 to the ceramic laminate 10.

Last, as shown in FIG. 10, the whole periphery of the side surfaces of the ceramic laminate 10 is molded with the molding material 35 made of a silicon resin as an insulating resin, thereby completing the laminated piezoelectric element 1.

Other parts are produced using a method similar to that according to Example 1.

In the present example, the trenches 13 recessed inward are formed on only the lower-end protection layer 12b out of the protection layers 12a and 12b formed on the ceramic laminate 10. In this case, the peeling off of the electrically conductive adhesive 33 can be sufficiently suppressed.

In the present example, the electrically conductive adhesive 33 is widely coated on the side surfaces 121b and 122b of the lower-end protection layer 12b. Therefore, the peeling off of the electrically conductive adhesive 33 can be more sufficiently suppressed.

Other parts have effect similar to that obtained according to Example 1.

In the present example, while the trenches 13 recessed inward are formed on only the lower-end protection layer 12b, of the protection layers 12a and 12b, the trenches 13 can be also formed on only the upper-end protection layer 12a.

The formation of the trenches 13 on only one of the protection layers 12a and 12b can be also applied to the second to Example 7s as well as Example 1.

Example 9

According to Example 9, the laminated piezoelectric element 1 in Example 1 is used as a piezoelectric actuator for the injector 6.

Figure 34:
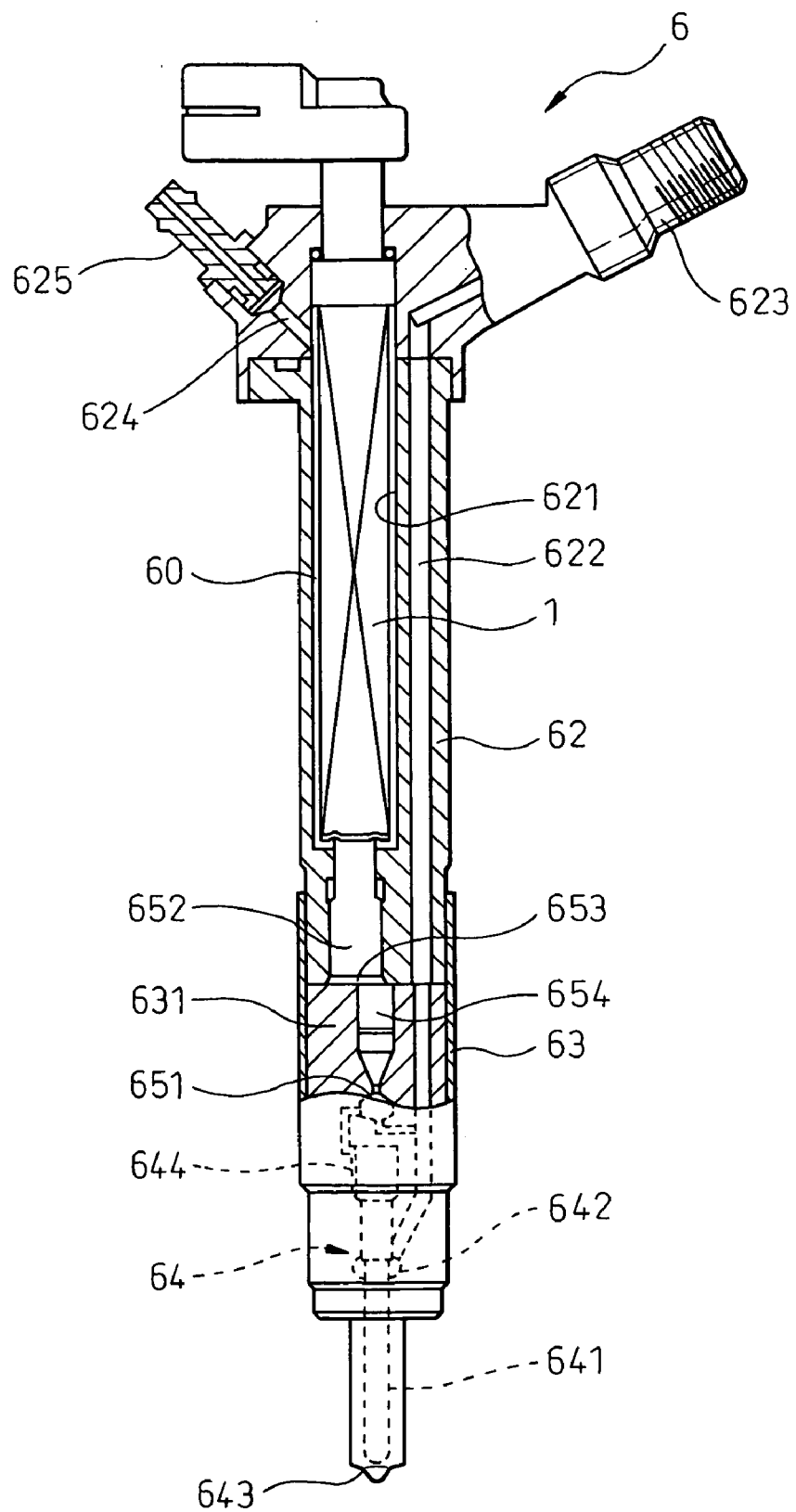
FIG. 34 is an explanatory diagram of a configuration of an injector according to Example 9.

The injector 6 according to the present example is applied to a common rail injection system of a diesel engine, as shown in FIG. 34.

As shown in FIG. 34, the injector 6 includes an upper housing 62 that accommodates the laminated piezoelectric element 1 as a driving section, and a lower housing 63 that is fixed to a lower end of the upper housing 62 and that has an injection nozzle 64 formed inside the lower housing 63.

The upper housing 62 has approximately a circular cylindrical shape, and has the laminated piezoelectric element 1 inserted into and fixed to a vertical hole 621 that is eccentric to a center axis.

A high-pressure fuel path 622 is provided on the side surface of the vertical hole 621 in parallel. The upper end of the high-pressure fuel path 622 is communicated to an external common rail not shown through a fuel induction pipe 623 that is stretched to the upper side of the upper housing 62.

A fuel outlet pipe 625 communicated to a drain path 624 is provided in extension on an upper side of the upper housing 62. Fuel that flows from the fuel outlet pipe 625 is returned to a fuel tank not shown.

The drain path 624 is communicated to a three-way valve 651 described later via a gap 60 between the vertical hole 621 and the driving section (i.e., the laminated piezoelectric element) 1 and through a path, not shown, that extends downward within the upper and the lower housings 62 and 63 from the gap 60.

The injection nozzle 64 includes a nozzle needle 641 that slides in up and down directions within a piston body 631, and an injection hole 643 from which high-pressure fuel, supplied from a fuel pool 642, is injected to each cylinder of the engine by being opened and closed with the nozzle needle 641. The fuel pool 642 is provided around the intermediate part of the nozzle needle 641. The lower end of the high-pressure fuel path 622 is opened at the intermediate part of the nozzle needle 641. The nozzle needle 641 receives a fuel pressure to a valve-opening direction from the fuel pool 642, and also receives a fuel pressure to a valve-closing direction from a back-pressure chamber 644 provided facing the upper end surface. When the pressure of the back-pressure chamber 644 decreases, the nozzle needle 641 is lifted up, and the injection hole 643 is opened, thereby injecting the fuel.

The pressure of the back-pressure chamber 644 is increased or decreased by the three-way valve 651. The three-way valve 651 is selectively communicated to the back-pressure chamber 644, the high-pressure fuel path 622, or the drain path 624. The three-way valve 651 has a ball-shaped valve that opens or closes a port communicated to the high-pressure fuel path 622 or the drain path 624. The driving section 1 drives the valve via a large-diameter piston 652, a hydraulic control chamber 653, and a small-diameter piston 654.

In the present example, the laminated piezoelectric element 1 explained in Example 1 is used for the driving source of the injector 6 having the above configuration. The laminated piezoelectric element 1 has the configuration excellent in durability and reliability. Therefore, the total performance of the injector 6 can be improved.

What is claimed is:

1. A laminated piezoelectric element comprising a ceramic laminate formed by alternately laminating piezoelectric layers of a piezoelectric material and inner electrode layers having electrical conductivity and by having protection layers of ceramics formed at both ends of the ceramic laminate in a lamination direction, and an external electrode connected to side surfaces of the ceramic laminate via an electrically conductive adhesive, wherein
   one or more trenches recessed inward are formed on side surfaces of at least one of the protection layers formed at both ends of the ceramic laminate, and the electrically conductive adhesive is filled in at least a part of the trenches.

2. The laminated piezoelectric element according to claim 1, wherein the protection layer is made of the same piezoelectric material as that of the piezoelectric layer.

3. The laminated piezoelectric element according to claim 1 wherein the trenches are formed on the whole periphery of the side surface of the protection layer.

4. The laminated piezoelectric element according to claim 1 wherein the trenches are intermittently formed in a predetermined pattern.

5. The laminated piezoelectric element according to claim 1, wherein a size of at least a part of the internal width of the trench is larger than a size of the width of an opening exposed to the side surfaces of the protection layer.

6. The laminated piezoelectric element according to claim 1, wherein the laminated piezoelectric element is an injector piezoelectric actuator that is used for a drive source of an injector.

* * * * *